(12) United States Patent
Inno

(10) Patent No.: US 7,811,743 B2
(45) Date of Patent: *Oct. 12, 2010

(54) METHOD FOR PREPARATION OF LITHOGRAPHIC PRINTING PLATE AND LITHOGRAPHIC PRINTING PLATE PRECURSOR

(75) Inventor: Toshifumi Inno, Shizoka (JP)

(73) Assignee: FUJIFILM Corporation, Tokyo (JP)

( * ) Notice: Subject to any disclaimer, the term of this patent is extended or adjusted under 35 U.S.C. 154(b) by 325 days.

This patent is subject to a terminal disclaimer.

(21) Appl. No.: 11/607,961

(22) Filed: Dec. 4, 2006

(65) Prior Publication Data

US 2007/0128550 A1 Jun. 7, 2007

(30) Foreign Application Priority Data

| Dec. 2, 2005 | (JP) | 2005-349608 |
| Apr. 27, 2006 | (JP) | 2006-123824 |

(51) Int. Cl.
G03F 1/00 (2006.01)
G03F 7/00 (2006.01)
G03F 7/26 (2006.01)

(52) U.S. Cl. ............ 430/302; 430/271.1; 430/281.1; 430/138; 430/270.1; 101/453; 101/463.1

(58) Field of Classification Search .......... 430/270.1, 430/302
See application file for complete search history.

(56) References Cited

U.S. PATENT DOCUMENTS

| 4,259,434 A * | 3/1981 | Yamasue et al. ............ 430/302 |
| 6,180,181 B1 * | 1/2001 | Verardi et al. ............. 427/409 |
| 6,723,493 B2 | 4/2004 | Teng |
| 2002/0142249 A1 * | 10/2002 | Ohshima .................. 430/283.1 |
| 2003/0186162 A1 * | 10/2003 | Takahashi et al. ......... 430/270.1 |
| 2004/0013968 A1 | 1/2004 | Teng |
| 2005/0221226 A1 * | 10/2005 | Yamasaki ................ 430/270.1 |
| 2006/0270769 A1 * | 11/2006 | Shoaf et al. ................ 524/236 |

FOREIGN PATENT DOCUMENTS

| EP | 1 342 568 A1 | 9/2003 |
| EP | 1349006 A1 * | 10/2003 |
| EP | 1356929 A2 * | 10/2003 |
| EP | 1630618 A2 * | 3/2006 |
| JP | 2002-365789 A | 12/2002 |
| WO | WO 2005029187 A1 * | 3/2005 |
| WO | WO 2005/111727 A | 11/2005 |

* cited by examiner

Primary Examiner—Cynthia H Kelly
Assistant Examiner—Chanceity N Robinson
(74) Attorney, Agent, or Firm—Sughrue Mion, PLLC

(57) ABSTRACT

A method for preparing a lithographic printing plate comprising: exposing a lithographic printing plate precursor comprising a hydrophilic support, a photosensitive layer containing (A) a sensitizing dye having an absorption maximum in a wavelength range of from 350 to 450 nm represented by the formula (I) or (II) as defined herein, (B) a polymerization initiator, (C) a polymerizable compound and (D) a hydrophobic binder polymer having an acid value of 0.3 meq/g or less and a protective layer provided in this order with a laser beam of from 350 to 450 nm; and rubbing a surface of the exposed lithographic printing plate precursor with a rubbing member in a presence of a developer having pH of from 2 to 10 in an automatic processor equipped with the rubbing member to remove the protective layer and an unexposed area of the photosensitive layer.

21 Claims, 1 Drawing Sheet

METHOD FOR PREPARATION OF LITHOGRAPHIC PRINTING PLATE AND LITHOGRAPHIC PRINTING PLATE PRECURSOR

FIELD OF THE INVENTION

The present invention relates to a method for preparation of a lithographic printing plate and a lithographic printing plate precursor for use in the method.

BACKGROUND OF THE INVENTION

In general, a lithographic printing plate has a surface composed of an oleophilic image area and a hydrophilic non-image area. Lithographic printing is a printing method comprising supplying alternately dampening water and oily ink on the surface of lithographic printing plate, making the hydrophilic non-image area a dampening water-receptive area (ink unreceptive area) and depositing the oily ink only to the oleophilic image area by utilizing the nature of the dampening water and oily ink to repel with each other, and then transferring the ink to a printing material, for example, paper.

In order to produce the lithographic printing plate, a lithographic printing plate precursor (PS plate) comprising a hydrophilic support having provided thereon an oleophilic photosensitive layer (image-recording layer) has heretofore been broadly used. Ordinarily, a lithographic printing plate is obtained by conducting plate making by a method of exposing the lithographic printing plate precursor through an original, for example, a lith film, and then treating the exposed lithographic printing plate precursor to remove the photosensitive layer in the unnecessary non-image area by dissolving with a an alkaline developer or an organic solvent thereby revealing a surface of the hydrophilic support to form the non-image area while leaving the photosensitive layer in the image area.

In the hitherto known plate-making process of lithographic printing plate precursor, after the exposure, the step of removing the unnecessary photosensitive layer by dissolving, for example, with a developer is required. However, it is one of the subjects to simplify such an additional wet treatment described above. As one means for the simplification, it has been desired to conduct the development with a nearly neutral aqueous solution or simply with water.

On the other hand, digitalized technique of electronically processing, accumulating and outputting image information using a computer has been popularized in recent years, and various new image outputting systems responding to the digitalized technique have been put into practical use. Correspondingly, attention has been drawn to a computer-to-plate technique of carrying the digitalized image information on highly converging radiation, for example, laser light and conducting scanning exposure of a lithographic printing plate precursor with the light thereby directly preparing a lithographic printing plate without using a lith film. Thus, it is one of the important technical subjects to obtain a lithographic printing plate precursor adaptable to the technique described above.

Based on the background described above, adaptation of plate making operation to both simplification and digitalization has been demanded strongly more and more than ever before.

In response to such a demand, for instance, it is described in JP-A 2002-365789 (the term "JP-A" as used herein means an "unexamined published Japanese patent application") that by incorporating a compound having an ethylene oxide chain into an image-forming layer of a lithographic printing plate precursor comprising a hydrophilic support and the image-forming layer containing a hydrophobic precursor, a hydrophilic resin and a light to heat converting agent, the lithographic printing plate precursor enables printing after conducting exposure and wet development processing using as a developer, water or an appropriate aqueous solution, besides on-machine development.

Also, a processing method of lithographic printing plate precursor is described in U.S. Patent Publication No. 2004/0013968 which comprises preparing a lithographic printing plate precursor comprising (i) a hydrophilic support and (ii) an oleophilic heat-sensitive layer which contains a radical-polymerizable ethylenically unsaturated monomer, a radical polymerization initiator and an infrared absorbing dye, is hardened with infrared laser exposure and is developable with an aqueous developer containing 60% by weight or more of water and having pH of 2.0 to 10.0, exposing imagewise the lithographic printing plate precursor with an infrared laser, and removing the unhardened region of the heat-sensitive layer with the aqueous developer.

SUMMARY OF THE INVENTION

In order to maintain developing property to the aqueous developer having pH of 2.0 to 10.0, however, it is necessary for the photosensitive layer to be hydrophilic or highly water-permeable, and it becomes a big problem to achieve a good balance between such hydrophilic or highly water-permeable property of the photosensitive layer and the water-resistance and film strength of the photosensitive layer after exposure and hardening.

As a means to solve the problem, it is considered to increase sensitivity, specifically, to increase discrimination of the water resistance between the unexposed area and the exposed area in a reaction system of high hardening efficiency. However, as well as the increase in sensitivity, it is required not to form fog during handling under a safelight.

The present invention responds to the problem. Specifically, an object of the invention is to provide a plate-making method in which a lithographic printing plate precursor is developed with an aqueous developer having pH of 2.0 to 10.0 to provide a good printing plate, and a lithographic printing plate precursor for use in the method which has high sensitivity and is excellent in safelight aptitude.

The inventor has found that the above-described object can be achieved by the following constructions.

(1) A method for preparation of a lithographic printing plate comprising exposing a lithographic printing plate precursor comprising a hydrophilic support, a photosensitive layer containing (A) a sensitizing dye having an absorption maximum in a wavelength range of 350 to 450 nm represented by formula (I) or (II) shown below, (B) a polymerization initiator, (C) a polymerizable compound and (D) a hydrophobic binder polymer having an acid value of 0.3 meq/g or less and a protective layer provided in this order with a laser beam of 350 to 450 nm, and rubbing a surface of the exposed lithographic printing plate precursor with a rubbing member in the presence of a developer having pH of 2 to 10 in an automatic processor equipped with the rubbing member to remove the protective layer and an unexposed area of the photosensitive layer:

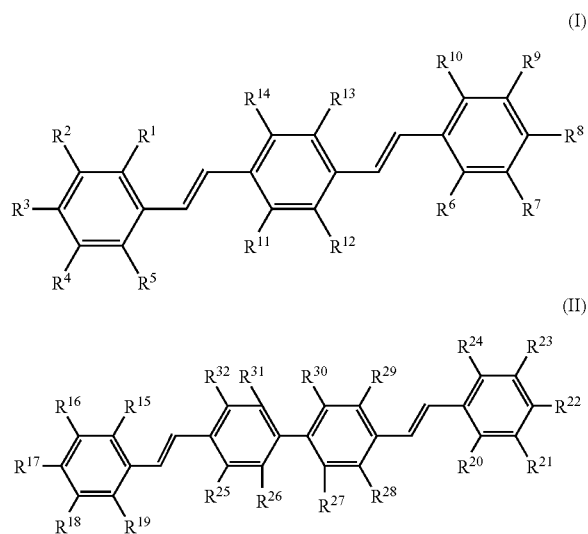

wherein $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms; $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

(2) The method for preparation of a lithographic printing plate as described in (1) above, wherein (B) the polymerization initiator is a hexaarylbiimidazole compound.

(3) The method for preparation of a lithographic printing plate as described in (2) above, wherein the photosensitive layer further contains (E) a chain transfer agent.

(4) The method for preparation of a lithographic printing plate as described in (3) above, wherein (E) the chain transfer agent is a thiol compound represented by the following formula (T):

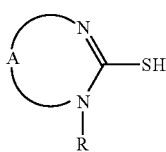

wherein R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

(5) The method for preparation of a lithographic printing plate as described in any one of (1) to (4) above, wherein (D) the hydrophobic binder polymer is at least one member selected from the group consisting of a (meth)acrylic copolymer having a crosslinkable group in a side chain or a polyurethane resin having a crosslinkable group in a side chain.

(6) The method for preparation of a lithographic printing plate as described in any one of (1) to (5) above, wherein a part or all of components of the photosensitive layer is encapsulated in a microcapsule.

(7) The method for preparation of a lithographic printing plate as described in any one of (1) to (6) above, wherein the rubbing member comprises at least two rotating brush rollers.

(8) The method for preparation of a lithographic printing plate as described in any one of (1) to (7) above, wherein the pH of the developer is from 3 to 8.

(9) The method for preparation of a lithographic printing plate as described in any one of (1) to (8) above, wherein the exposed lithographic printing plate precursor is subjected to a heat treatment between the exposure and the development.

(10) A lithographic printing plate precursor comprising a hydrophilic support, a photosensitive layer containing (A) a sensitizing dye having an absorption maximum in a wavelength range of 350 to 450 nm represented by formula (I) or (II) shown below, (B) a polymerization initiator, (C) a polymerizable compound and (D) a hydrophobic binder polymer having an acid value of 0.3 meq/g or less and a protective layer provided in this order, wherein the protective layer and an unexposed area of the photosensitive layer is capable of being removed by exposing the lithographic printing plate precursor with a laser beam of 350 to 450 nm and rubbing a surface of the exposed lithographic printing plate precursor with a rubbing member in the presence of a developer having pH of 2 to 10 in an automatic processor equipped with the rubbing member:

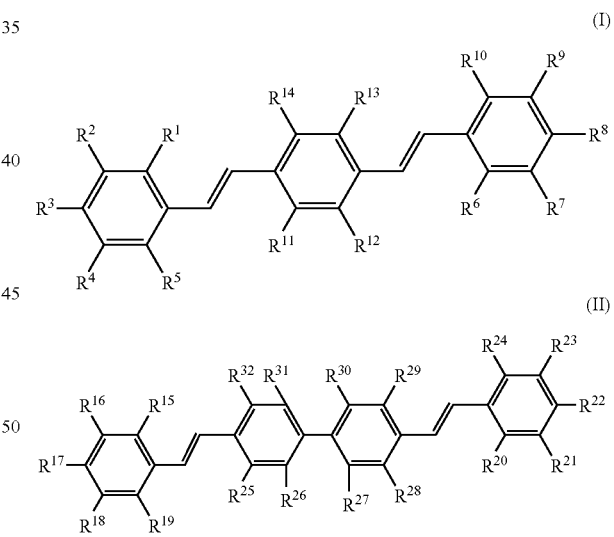

wherein $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms; $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

(11) The lithographic printing plate precursor as described in (10) above, wherein (B) the polymerization initiator is a hexaarylbiimidazole compound.

(12) The lithographic printing plate precursor as described in (11) above, wherein the photosensitive layer further contains (E) a chain transfer agent.
(13) The lithographic printing plate precursor as described in (12) above, wherein (E) the chain transfer agent is a thiol compound represented by the following formula (T):

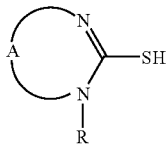

(T)

wherein R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.
(14) The lithographic printing plate precursor as described in any one of (10) to (13) above, wherein the exposed lithographic printing plate precursor is subjected to a heat treatment between the exposure and the development.
(15) The method for preparation of a lithographic printing plate as described in any one of (1) to (9) above, wherein the developer contains a surfactant represented by the following formula (III) or (IV):

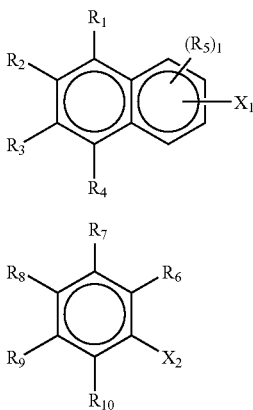

(III)

(IV)

In the formulae, $R_1$ to $R_{10}$ each represents a hydrogen atom or an alkyl group; 1 represents an integer of 1 to 3; $X_1$ and $X_2$ each represents a sulfonate, a sulfuric monoester salt, a carboxylate or a phosphate; and provided that a total number of carbon atoms included in $R_1$ to $R_5$ or $R_6$ to $R_{10}$ is 3 or more.
(16) The method for preparation of a lithographic printing plate as described in any one of (1) to (9) above, wherein the developer contains a surfactant represented by the following formula (V) or (VI):

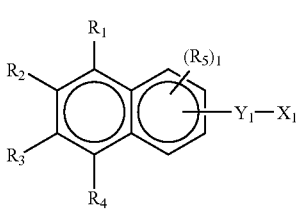

(V)

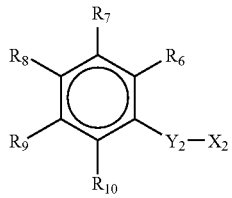

(VI)

In the formulae, $R_1$ to $R_{10}$ each represents a hydrogen atom or an alkyl group; 1 represents an integer of 1 to 3; $X_1$ and $X_2$ each represents a sulfonate, a sulfuric monoester salt, a carboxylate or a phosphate; $Y_1$ and $Y_2$ each represents —$C_nH_{2n}$—, —$C_{n-m}H_{2(n-m)}OC_mH_{2m}$—, —O—$(CH_2CH_2O)_n$—, —O—$(CH_2CH_2CH_2O)_n$— or —CO—NH— wherein $n \geq 1$ and $n \geq m \geq 0$; and provided that a total number of carbon atoms included in $R_1$ to $R_5$ and $Y_1$ or $R_6$ to $R_{10}$ and $Y_2$ is 3 or more.
(17) The method for preparation of a lithographic printing plate as described in any one of (1) to (9) above, wherein the developer contains a surfactant represented by any on of the following formulae (VII) to (IX):

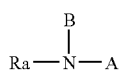

(VII)

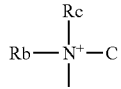

(VIII)

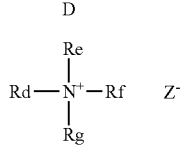

(IX)

In formula (VII), $R_a$ represents a hydrogen atom or an alkyl group; and A and B each represents a group containing an ethylene oxide group, a carboxylic acid group or a carboxylate.
In formula (VIII), $R_b$ and $R_c$ each represents a hydrogen atom or an alkyl group; C represents an alkyl group or a group containing an ethylene oxide group; and D represents a group containing a carboxylic acid anion.
In formula (IX), $R_d$, $R_e$, $R_f$ and $R_g$ each represents a hydrogen atom or an alkyl group; and $Z^-$ represents a counter anion.

According to the present invention, a plate-making method where a lithographic printing plate precursor which has high sensitivity and is excellent in safelight aptitude is developed with an aqueous developer having pH of 2.0 to 10.0 to prepare a good printing plate can be provided.

DETAILED DESCRIPTION OF THE INVENTION

[Lithographic Printing Plate Precursor]

Figure 1:
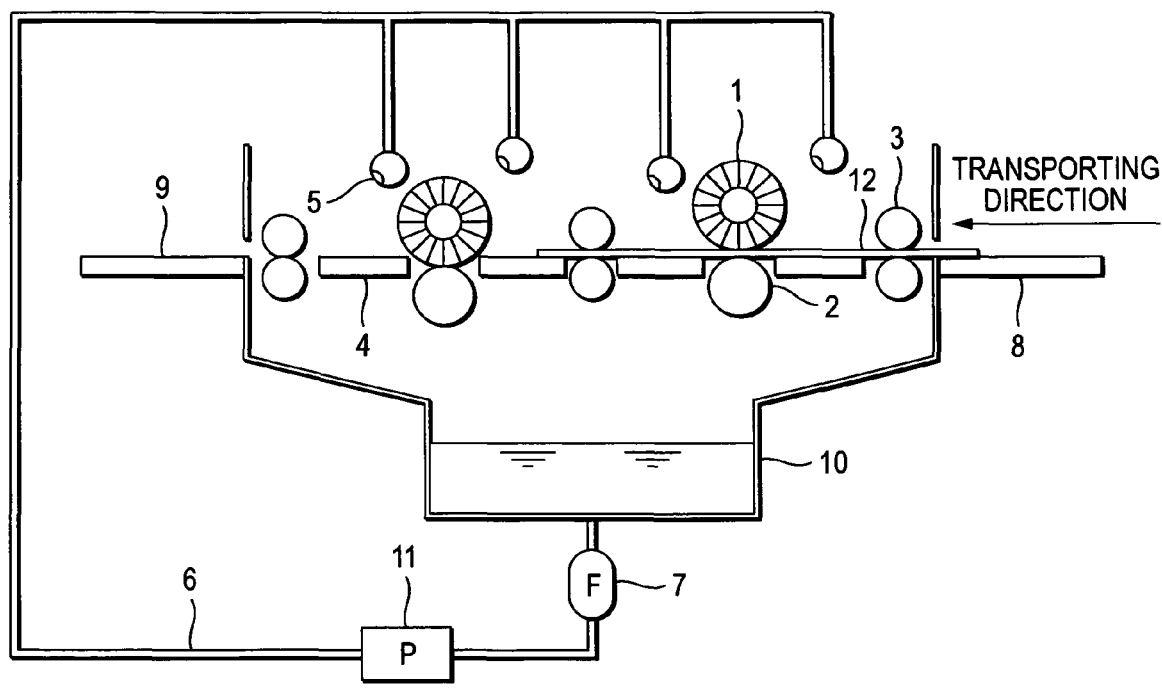
FIG. 1 shows a structure of an automatic development processor.
Description of reference numerals and signs:
1: Rotating brush roller
2: Backing roller
3: Transport roller
4: Transport guide plate
5: Spray pipe 6: Pipe line
7: Filter
8: Plate supply table
9: Plate discharge table
10: Developer tank
11: Circulating pump
12: Plate

First, the lithographic printing plate precursor for use in the invention is described in detail below.

<Photosensitive Layer>

The photosensitive layer of the lithographic printing plate precursor according to the invention contains (A) a sensitizing dye having an absorption maximum in a wavelength range of 350 to 450 nm represented by formula (I) or (II) shown below, (B) a polymerization initiator, (C) a polymerizable compound and (D) a hydrophobic binder polymer having an acid value of 0.3 meq/g or less.

According to the above-described embodiment, a lithographic printing plate precursor which has high sensitivity at exposure with a laser beam of 350 to 450 nm and is excellent in safelight aptitude can be obtained.

The photosensitive layer may further contain other components, if desired. The constituting components of the photosensitive layer are described in more detail below.

(A) Sensitizing Dye

The photosensitive layer according to the invention includes the sensitizing dye having an absorption maximum in a wavelength range of 350 to 450 nm represented by the following formula (I) or (II):

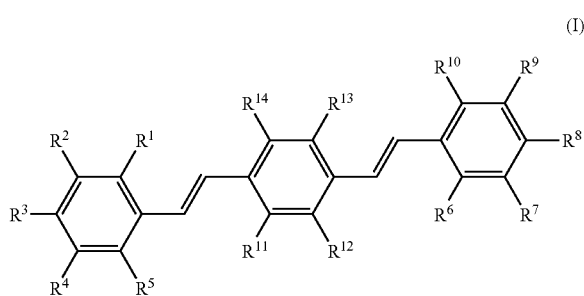

(I)

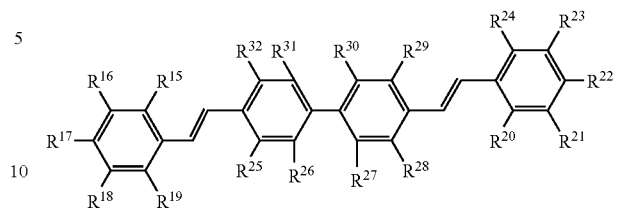

(II)

wherein $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms; and $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

The alkyl group or alkoxy group may have a substituent and may be a straight-chain or branched form, but the branched form is preferable. Examples of the substituent include a halogen atom and a hydroxy group.

Also, the alkylene chain of the alkyl group or alkoxy group may include an ester bond, an ether bond or a thioether bond.

$R^1$, $R^5$, $R^6$, $R^{10}$, $R^{11}$, $R^{12}$, $R^{13}$ and $R^{14}$ each independently preferably represents a hydrogen atom, a fluorine atom or a chlorine atom. In particular, it is preferable that $R^1$, $R^5$, $R^6$ and $R^{10}$ each represents a hydrogen atom, $R^2$ to $R^4$ and $R^7$ to $R^9$ each independently represents an alkoxy group, and at least two of $R^2$ to $R^4$ and $R^7$ to $R^9$ each represents a branched alkoxy group having from 3 to 15 carbon atoms.

Also, it is especially preferable that $R^2$, $R^4$, $R^7$ and $R^9$ each represents a methoxy group, and $R^3$ and $R^8$ each represents a branched alkoxy group having from 3 to 15 carbon atoms.

$R^{15}$, $R^{19}$, $R^{20}$, $R^{24}$ and $R^{25}$ to $R^{32}$ each independently preferably represents a hydrogen atom, a fluorine atom or a chlorine atom. In particular, it is preferable that $R^{15}$, $R^{19}$, $R^{20}$ and $R^{24}$ each represents a hydrogen atom, $R^{16}$ to $R^{18}$ and $R^{21}$ to $R^{23}$ each independently represents an alkoxy group, and at least two of $R^{16}$ to $R^{18}$ and $R^{21}$ to $R^{23}$ each represents a branched alkoxy group having from 3 to 15 carbon atoms.

Also, it is especially preferable that $R^{16}$, $R^{18}$, $R^{21}$ and $R^{23}$ each represents a methoxy group, and $R^{17}$ and $R^{22}$ each represents a branched alkoxy group having from 3 to 15 carbon atoms.

Specific examples of the sensitizing dye having an absorption maximum in a wavelength range of 350 to 450 nm represented by formula (I) or (II) are set forth below, but the invention should not be construed as being limited thereto.

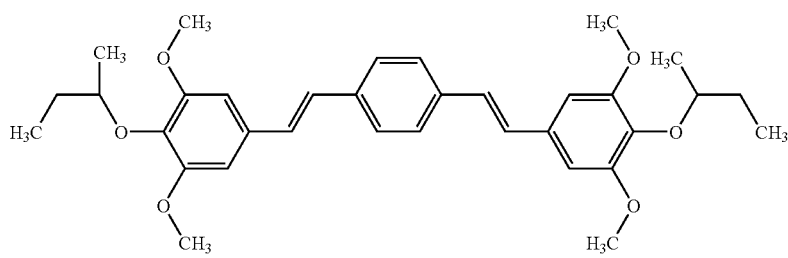

-continued
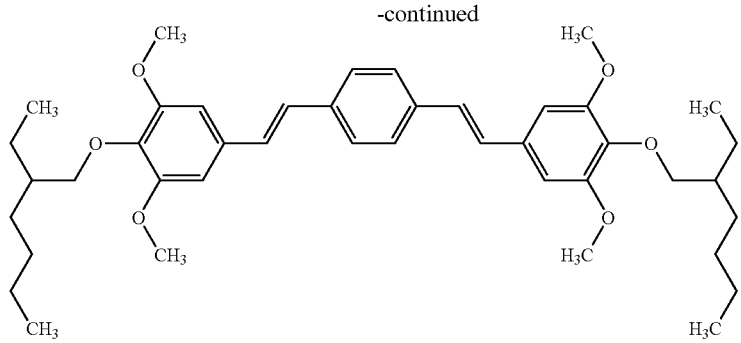
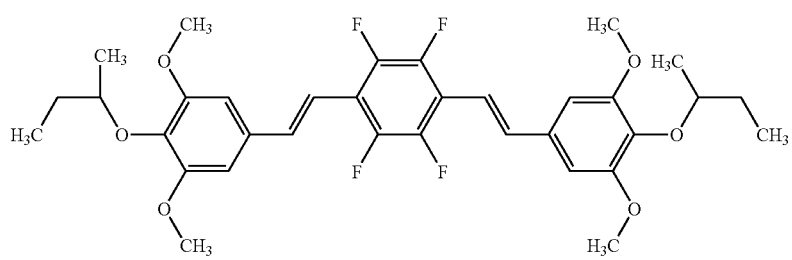
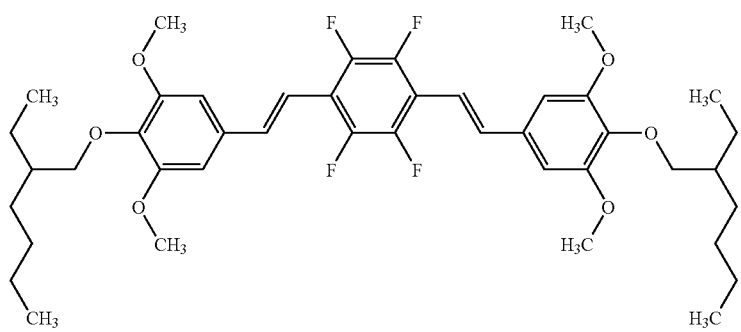
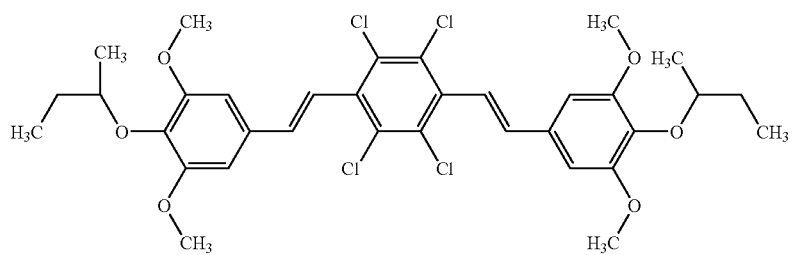
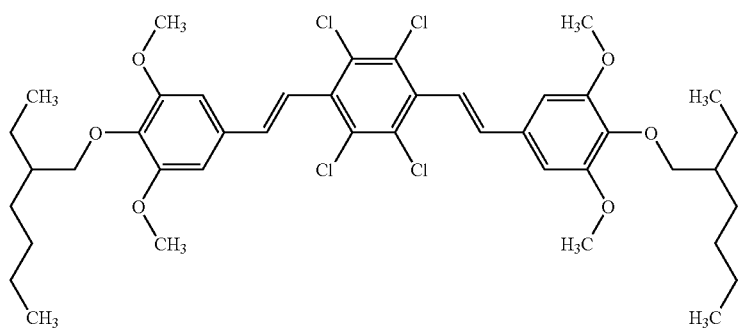

-continued
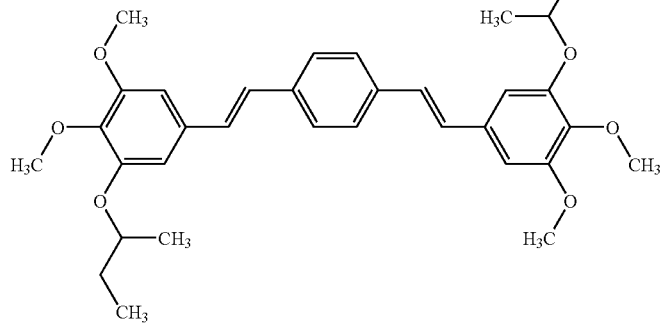
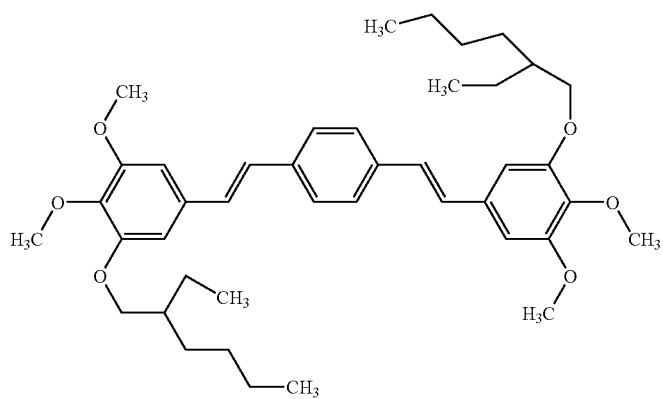
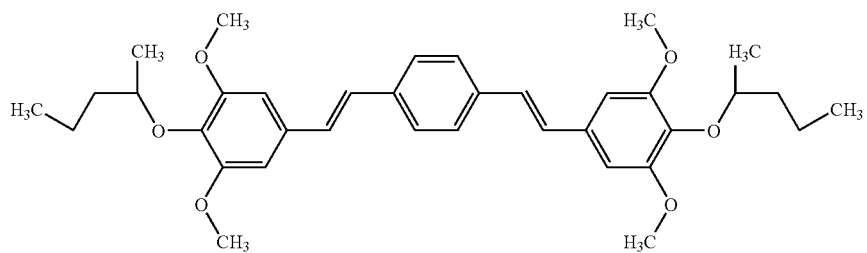
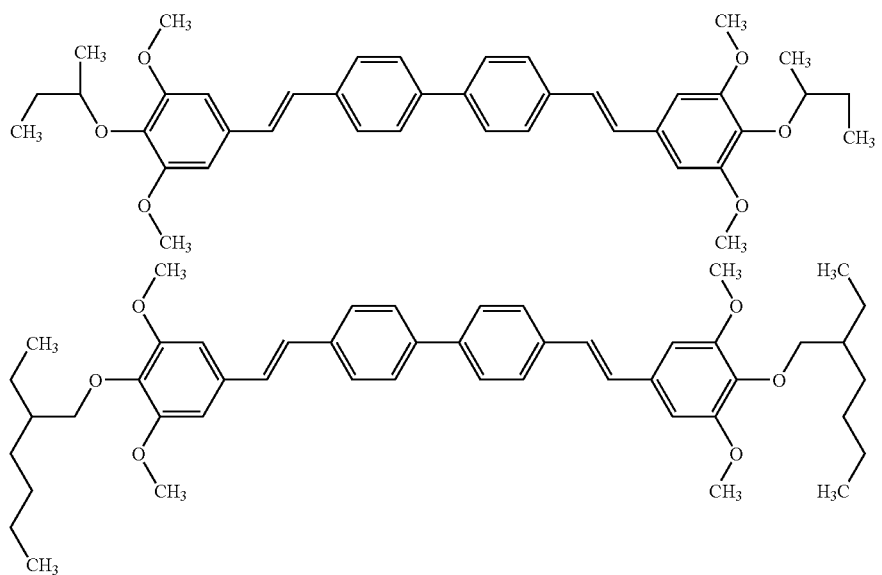

The sensitizing dye described above can be synthesized according to known methods, for example, methods described in WO2005/029187.

Details of the method of using the sensitizing dye, for example, selection of the structure, individual or combination use or an amount added, can be appropriately determined in accordance with the characteristic design of the final lithographic printing plate precursor.

For instance, when two or more sensitizing dyes are used in combination, the compatibility thereof in a photosensitive composition constituting the photosensitive layer can be increased. For the selection of sensitizing dye, the molar absorption coefficient thereof at the emission wavelength of the light source used is an important factor in addition to the photosensitivity. Use of the dye having a large molar absorption coefficient is profitable, because the amount of dye added can be made relatively small. Also, in case of using in a lithographic printing plate precursor, the use of such a dye is advantageous in view of physical properties of the photosensitive layer. Since the photosensitivity and resolution of the photosensitive layer and the physical properties of the exposed area of the photosensitive layer are greatly influenced by the absorbance of sensitizing dye at the wavelength of light source, the amount of the sensitizing dye added is appropriately determined by taking account of these factors.

However, for the purpose of hardening a layer having a large thickness, for example, of 5 μm or more, low absorbance is sometimes rather effective for increasing the hardening degree. In the case of using in a lithographic printing plate precursor where the photosensitive layer has a relatively small thickness, the amount of the sensitizing dye added is preferably selected such that the photosensitive layer has an absorbance from 0.1 to 1.5, preferably from 0.25 to 1. Ordinarily, the amount of the sensitizing dye added is preferably from 0.05 to 30 parts by weight, more preferably from 0.1 to 20 parts by weight, and most preferably from 0.2 to 10 parts by weight, per 100 parts by weight of the total solid content of the photosensitive layer.

(B) Polymerization Initiator

The polymerization initiator for use in the invention includes, for example, a trihalomethyl compound, a carbonyl compound, an organic peroxide, an azo compound, an azide compound, a metallocene compound, a hexaarylbiimidazole compound, an organic boron compound, a disulfone compound, an oxime ester compound and an onium salt compound. Among them, at least one compound selected from the group consisting of the hexaarylbiimidazole compound, onium salt compound, trihalomethyl compound and metallocene compound is preferable, and the hexaarylbiimidazole compound is particularly preferable. The polymerization initiators may be appropriately used in combination of two or more thereof.

The hexaarylbiimidazole polymerization initiator includes, for example, lophine dimers described in JP-B-45-37377 and JP-B-44-86516 (the term "JP-B" as used herein means an "examined Japanese patent publication"), specifically,
2,2'-bis(o-chlorophenyl)-4,4',5,5'-tetraphenylbiimidazole,
2,2'-bis(o-bromophenyl)-4,4',5,5'-tetraphenylbiimidazole,
2,2'-bis(o,p-dichlorophenyl)-4,4',5,5'-tetraphenylbiimidazole,
2,2'-bis(o-chlorophenyl)-4,4',5,5'-tetra(m-methoxyphenyl) biimidazole,
2,2'-bis(o,o'-dichlorophenyl)-4,4',5,5'-tetraphenylbiimidazole,
2,2'-bis(o-nitrophenyl)-4,4',5,5'-tetraphenylbiimidazole,
2,2'-bis(o-methylphenyl)-4,4',5,5'-tetraphenylbiimidazole and
2,2'-bis(o-trifluoromethylphenyl)-4,4',5,5'-tetraphenylbiimidazole.

The trihalomethyl compound preferably includes trihalomethyl-s-triazines, and specifically s-triazine derivatives having a tri-halogen-substituted methyl group described in JP-A-58-29803, for example, 2,4,6-tris(trichloromethyl)-s-triazine, 2-methoxy-4,6-bis(trichloromethyl)-s-triazine, 2-amino-4,6-bis(trichloromethyl)-s-triazine and 2-(p-methoxystyryl)-4,6-bis(trichloromethyl)-s-triazine.

The onium salt includes, for example, onium salts represented by the following formula (III):

In formula (III), $R^{11}$, $R^{12}$ and $R^{13}$, which may be the same or different, each represents a hydrocarbon group having 20 or less carbon atoms which may have a substituent. Preferred examples of the substituent include a halogen atom, a nitro group, an alkyl group having 12 or less carbon atoms, an alkoxy group having 12 or less carbon atoms and an aryloxy group having 12 or less carbon atoms.

$Z^-$ represents a counter ion selected from the group consisting of a halogen ion, a perchlorate ion, a tetrafluoroborate ion, a hexafluorophosphate ion, a carboxylate ion and a sulfonate ion, and is preferably a perchlorate ion, a hexafluorophosphate ion, a carboxylate ion or an arylsulfonate ion.

The metallocene compound can be used by appropriately selecting, for example, from known compounds described in JP-A-59-152396 and JP-A-61-151197. Specific examples thereof include dicyclopentadienyl-Ti-dichloride,
dicyclopentadienyl-Ti-bisphenyl,
dicyclopentadienyl-Ti-bis-2,3,4,5,6-pentafluorophen-1-yl,
dicyclopentadienyl-Ti-bis-2,3,5,6-tetrafluorophen-1-yl,
dicyclopentadienyl-Ti-bis-2,4,6-trifluorophen-1-yl,
dicyclopentadienyl-Ti-bis-2,6-difluorophen-1-yl,
dicyclopentadienyl-Ti-bis-2,4-difluorophen-1-yl,
dimethylcyclopentadienyl-Ti-bis-2,3,4,5,6-pentafluorophen-1-yl,
dimethylcyclopentadienyl-Ti-bis-2,3,5,6-tetrafluorophen-1-yl,
dimethylcyclopentadienyl-Ti-bis-2,4-difluorophen-1-yl and
bis(cyclopentadienyl)-bis-(2,6-difluoro-3-(pyr-1-yl)phenyl) titanium.

Examples of the carbonyl compound described above include, benzophenone derivatives, for example, benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, for example, 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl) ketone, 1-hydroxy-1-(p-dodecylphenyl)ketone, 2-methyl-(4'-(methylthio)phenyl)-2-morpholino-1-propane or 1,1,1,-trichloromethyl-(p-butylphenyl)ketone, thioxantone derivatives, for example, thioxantone, 2-ethylthioxantone, 2-isopropylthioxantone, 2-chlorothioxantone, 2,4-dimetylthioxantone, 2,4-dietylthioxantone or 2,4-diisopropylthioxantone, and benzoic acid ester derivatives, for example, ethyl p-dimethylaminobenzoate or ethyl p-diethylaminobenzoate.

Examples of the oxime ester compounds described above include compounds described in *J. C. S. Perkin II*, 1653-1660 (1979), *J. C. S. Perkin II*, 156-162 (1979), *Journal of Photopolymer Science and Technology*, 202-232 (1995) and JP-A-2000-66385, and compounds described in JP-A-2000-80068.

The polymerization initiators according to the invention can be preferably used individually or in combination of two or more thereof.

An amount of the polymerization initiator used in the photosensitive layer according to the invention is preferably from 0.01 to 20% by weight, more preferably from 0.1 to 15% by weight, and still more preferably from 1.0 to 10% by weight, based on the total solid content of the photosensitive layer.

(C) Polymerizable Compound

The polymerizable compound for use in the photosensitive layer according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or a mixture thereof. Examples of the monomer and copolymer thereof include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide (EO) modified triacrylate or polyester acrylate oligomer; methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane; itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; crotonic acid esters, for example, ethylene glycol dicrotonate, tetramethylene glycol dicrotonate, pentaerythritol dicrotonate or sorbitol tetracrotonate; isocrotonic acid esters, for example, ethylene glycol diisocrotonate, pentaerythritol diisocrotonate or sorbitol tetraisocrotonate; and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferred examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2-CH(R_5)OH \qquad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Further, a photosensitive composition having remarkably excellent photo-speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth) acrylic acid, described in JP-A-48-64183, JP-A-49-43191 and JP-B-52-30490. Specific unsaturated compounds described in JP-B-46-43946, JP-B-1-40337 and JP-B-1-

40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in Nippon Secchaku Kyokaishi (*Journal of Japan Adhesion Society*), Vol. 20, No. 7, pages 300 to 308 (1984) can also be used.

Details of the method of using the polymerizable compound, for example, selection of the structure, individual or combination use or an amount added, can be appropriately determined in accordance with the characteristic design of the final lithographic printing plate precursor. For instance, the compound is selected from the following standpoints.

In view of the sensitivity, a structure having a large content of unsaturated group per molecule is preferred and in many cases, a difunctional or more functional compound is preferred. Also, in order to increase the strength of the image area, that is, hardened layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the photosensitive layer. For instance, the compatibility may be improved in some cases by using the compound of low purity or using two or more kinds of the compounds in combination. A specific structure may be selected for the purpose of improving an adhesion property to a support, a protective layer or the like described hereinafter.

The polymerizable compound is used preferably in a range from 5 to 80% by weight, more preferably in a range from 25 to 75% by weight, based on the total solid content of the photosensitive layer. The polymerizable compounds may be used individually or in combination of two or more thereof. In the method of using the polymerizable compound, the structure, blend and amount added can be appropriately selected by taking account of the degree of polymerization inhibition due to oxygen, resolution, fogging property, change in refractive index, surface tackiness and the like. Further, depending on the case, a layer construction, for example, an undercoat layer or an overcoat layer, and a coating method, may also be considered.

(D) Hydrophobic Binder Polymer

The hydrophobic binder polymer which can be used in the photosensitive layer according to the invention is preferably a water-insoluble polymer. Further, the hydrophobic binder polymer which can be used in the invention preferably does not substantially contain an acid group, for example, a carboxy group, a sulfonic acid group or a phosphoric acid group. An acid value (acid content per g of polymer, indicated by the chemical equivalent number) of the binder polymer is preferably 0.3 meq/g or less, more preferably 0.1 meq/g or less. In the above-described range, film strength, water resistance and ink-receptive property of the photosensitive layer are increased and improvement in printing durability can be achieved.

Specifically, the hydrophobic binder polymer which can be used in the invention is preferably insoluble in water or an aqueous solution having a pH of 10 or more. The solubility (polymer concentration at the saturation dissolution) of the hydrophobic binder polymer in water or an aqueous solution having a pH of 10 or more is preferably 0.5% by weight or less, more preferably 0.1% by weight or less. The temperature for measuring the above-described solubility is temperature at plate-making development and it is 25° C. herein.

As for the hydrophobic binder polymer, conventionally known hydrophobic binder polymers preferably having the solubility in the above-described range can be used without limitation as long as the performance of the lithographic printing plate of the invention is not impaired, and a linear organic polymer having film-forming property is preferred.

Preferable examples of such a hydrophobic binder polymer include a polymer selected from an acrylic resin, a polyvinyl acetal resin, a polyurethane resin, a polyamide resin, an epoxy resin, a methacrylic resin, a styrene-based resin and a polyester resin. Among these, an acrylic resin is preferred, and a (meth)acrylic acid ester copolymer is more preferred. More specifically, a copolymer of a (meth)acrylic acid alkyl or aralkyl ester with a (meth)acrylic acid ester containing a —CH$_2$CH$_2$O— or —CH$_2$CH$_2$NH— unit in R of the ester residue (—COOR) of the (meth)acrylic acid ester is particularly preferred. The alkyl group in the (meth)acrylic acid alkyl ester is preferably an alkyl group having from 1 to 5 carbon atoms, more preferably a methyl group. Preferred examples of the (meth)acrylic acid aralkyl ester include benzyl(meth)acrylate.

The hydrophobic binder polymer can be imparted with a crosslinking property in order to increase the film strength of the image area.

In order to impart the crosslinking property to the binder polymer, a crosslinkable functional group, for example, an ethylenically unsaturated bond is introduced into a main chain or side chain of the polymer. The crosslinkable functional group may be introduced by copolymerization or a polymer reaction.

The term "crosslinkable group" as used herein means a group capable of crosslinking the polymer binder in the process of a radical polymerization reaction which is caused in the photosensitive layer, when the lithographic printing plate precursor is exposed to light. The crosslinkable group is not particularly restricted as long as it has such a function and includes, for example, an ethylenically unsaturated bonding group, an amino group or an epoxy group as a functional group capable of conducting an addition polymerization reaction. Also, a functional group capable of forming a radical upon irradiation with light may be used and such a crosslinkable group includes, for example, a thiol group, a halogen atom and an onium salt structure. Among them, the ethylenically unsaturated bonding group is preferable, and functional groups represented by formulae (1) to (3) shown below are particularly preferable.

Formula (1):

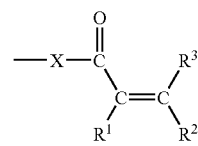

In formula (1), $R^1$ to $R^3$ each independently represents a hydrogen atom or a monovalent organic group. $R^1$ preferably includes, for example, a hydrogen atom or an alkyl group which may have a substituent. Among them, a hydrogen atom or a methyl group is preferable because of high radical reactivity. $R^2$ and $R^3$ each independently preferably includes, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

X represents an oxygen atom, a sulfur atom or —N($R^{12}$)—, and $R^{12}$ represents a hydrogen atom or a monovalent organic group. The monovalent organic group represented by $R^{12}$ includes, for example, an alkyl group which may have a substituent. Among them, a hydrogen atom, a methyl group, an ethyl group or an isopropyl group is preferable because of high radical reactivity.

Examples of the substituent introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group.

Formula (2):

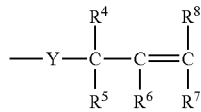

In formula (2), $R^4$ to $R^8$ each independently represents a hydrogen atom or a monovalent organic group. $R^4$ to $R^8$ each independently preferably includes, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable.

Examples of the substituent introduced include those described in Formula (1). Y represents an oxygen atom, a sulfur atom or —N($R^{12}$)—, and $R^{12}$ has the same meaning as $R^{12}$ defined in Formula (1). Preferred examples for $R^{12}$ are also same as those described in Formula (1).

Formula (3):

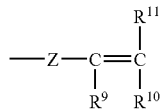

In formula (3), $R^9$ preferably represents a hydrogen atom or an alkyl group which may have a substituent. Among them, a hydrogen atom or a methyl group is preferable because of high radical reactivity. $R^{10}$ and $R^{11}$ each independently represents, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

Examples of the substituent introduced include those described in Formula (1). Z represents an oxygen atom, a sulfur atom, —N($R^{13}$)— or a phenylene group which may have a substituent. $R^{13}$ includes an alkyl group which may have a substituent or the like. Among them, a methyl group, an ethyl group or an isopropyl group is preferable because of high radical reactivity.

Among the polymers, a (meth)acrylic acid copolymer and a polyurethane each having a crosslinkable group in the side chain thereof are more preferable.

In the hydrophobic binder polymer having a crosslinking property, for example, a free radical (a polymerization initiating radical or a propagating radical in the process of polymerization of the polymerizable compound) is added to the crosslinkable functional group to cause an addition-polymerization between polymers directly or through a polymerization chain of the polymerizable compound, as a result, crosslinking is formed between polymer molecules to effect curing. Alternatively, an atom (for example, a hydrogen atom on the carbon atom adjacent to the functional crosslinkable group) in the polymer is withdrawn by a free radical to produce a polymer radical and the polymer radicals combine with each other to form crosslinking between polymer molecules to effect curing.

The content of the crosslinkable group (content of radical-polymerizable unsaturated double bond determined by iodine titration) in the hydrophobic binder polymer is preferably from 0.1 to 10.0 mmol, more preferably from 1.0 to 7.0 mmol, and most preferably from 2.0 to 5.5 mmol, per g of the hydrophobic binder polymer.

In view of improvement in the developing property with an aqueous solution, the binder polymer is preferably hydrophilic. On the other hand, in view of increasing the printing durability, it is important that the binder polymer has good compatibility with the polymerizable compound contained in the photosensitive layer, that is, the binder polymer is preferably oleophilic. From these standpoints, it is also effective in the invention to copolymerize a hydrophilic group-containing component and an oleophilic group-containing component in the hydrophobic binder polymer in order to improve the developing property and the printing durability. Examples of the hydrophilic group-containing component which can be preferably used include those having a hydrophilic group, for example, a hydroxy group, a carboxylate group, a hydroxyethyl group, an ethyleneoxy group, a hydroxypropyl group, a polyoxyethyl group, a polyoxypropyl group, an amino group, an aminoethyl group, an aminopropyl group, an ammonium group, an amido group and a carboxymethyl group.

The hydrophobic binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The hydrophobic binder polymer may be any of a random polymer, a block polymer, a graft polymer and the like, and it is preferably a random polymer.

The hydrophobic binder polymers may be used individually or in combination of two or more thereof.

From the standpoint of preferable strength of the image area and good image-forming property, the content of the hydrophobic binder polymer is from 5 to 90% by weight, preferably from 10 to 70% by weight, more preferably from 10 to 60% by weight, based on the total solid content of the photosensitive layer.

(E) Chain Transfer Agent

It is preferred to incorporate a chain transfer agent into the photosensitive layer according to the invention. The chain transfer agent contributes to improvements in the sensitivity and preservation stability. Compounds which function as the chain transfer agents include, for example, compounds containing SH, PH, SiH or GeH in their molecules. Such a compound donates hydrogen to a radical species of low activity to generate a radical, or is oxidized and then deprotonated to generate a radical.

In the photosensitive layer according to the invention, a thiol compound (for example, a 2-mercaptobenzimidazole) is particularly preferably used as the chain transfer agent.

Among them, a thiol compound represented by formula (T) shown below is particularly preferably used. By using the thiol compound represented by formula (T) as the chain transfer agent, a problem of the odor and decrease in sensitivity due to evaporation of the compound from the photosensitive layer or diffusion thereof into other layers are avoided and a lithographic printing plate precursor which is excellent in preservation stability and exhibits high sensitivity and good printing durability is obtained.

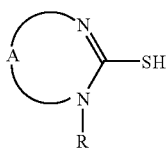
(T)

In formula (T), R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

Compounds represented by formulae (T-1) and (T-2) shown below are more preferably used.

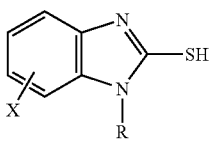
(T-1)

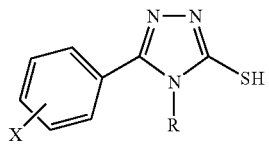
(T-2)

In formulae (T-1) and (T-2), R represents an alkyl group which may have a substituent or an aryl group which may have a substituent; and X represents a halogen atom, an alkoxy group which may have a substituent, an alkyl group which may have a substituent or an aryl group which may have a substituent.

Specific examples of the compound represented by formula (T) are set forth below, but the invention should not be construed as being limited thereto.

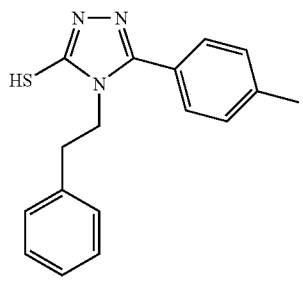

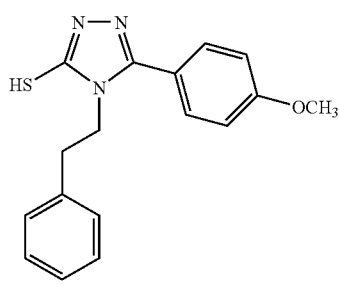

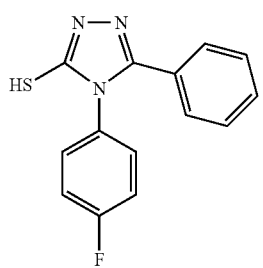

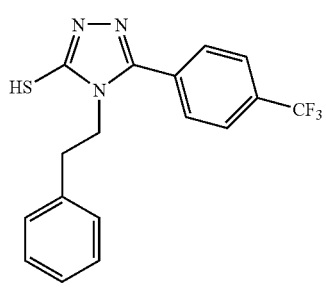

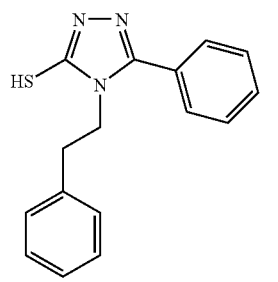
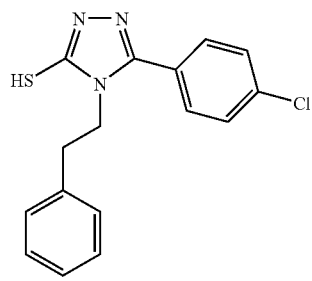
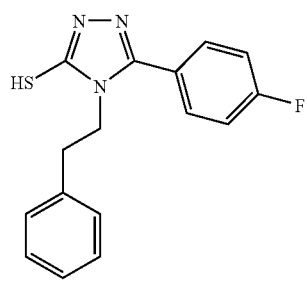
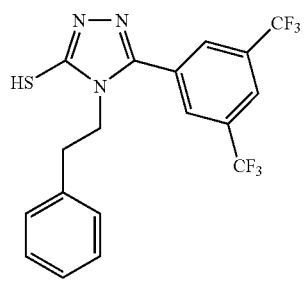
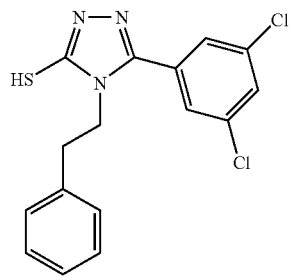
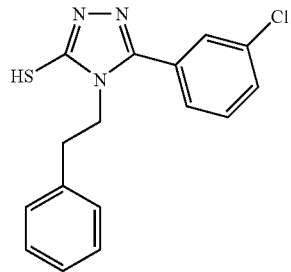
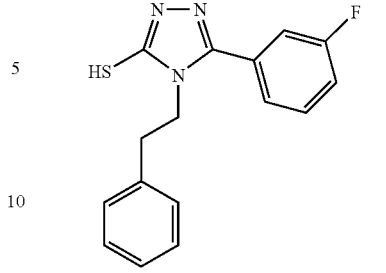
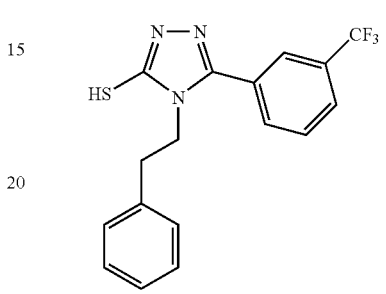
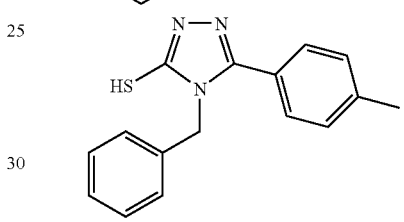
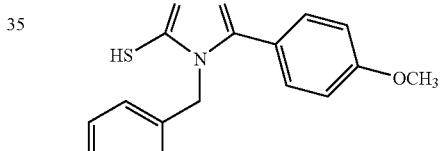
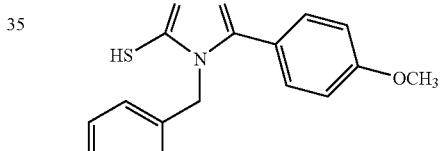
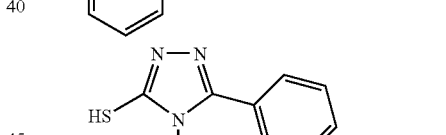
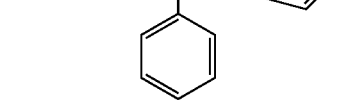
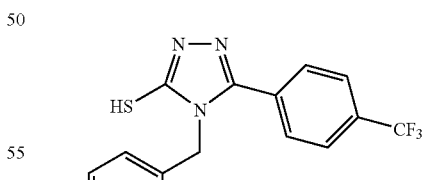
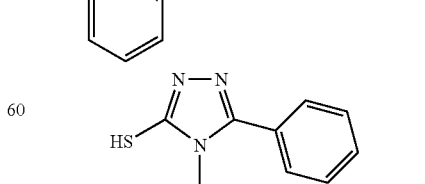
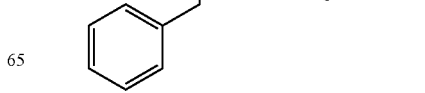

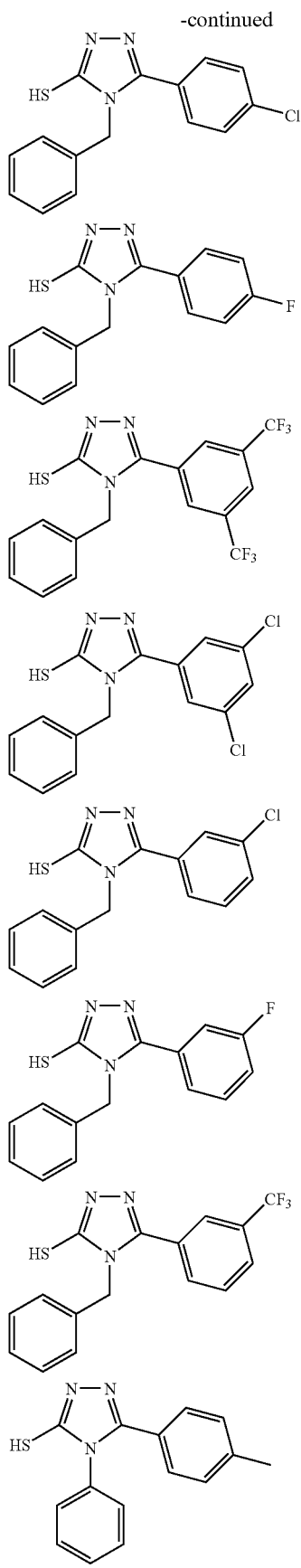
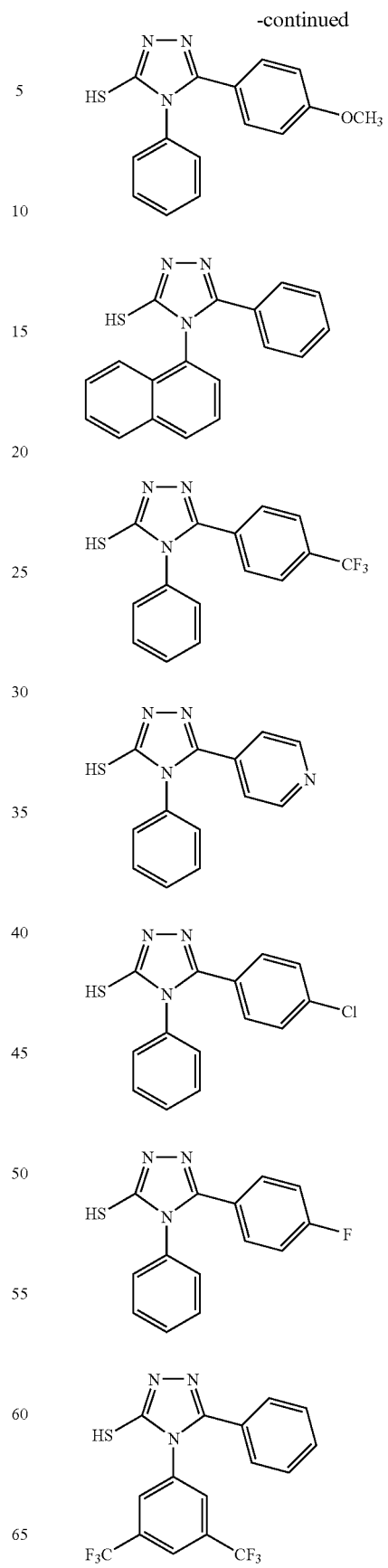

-continued
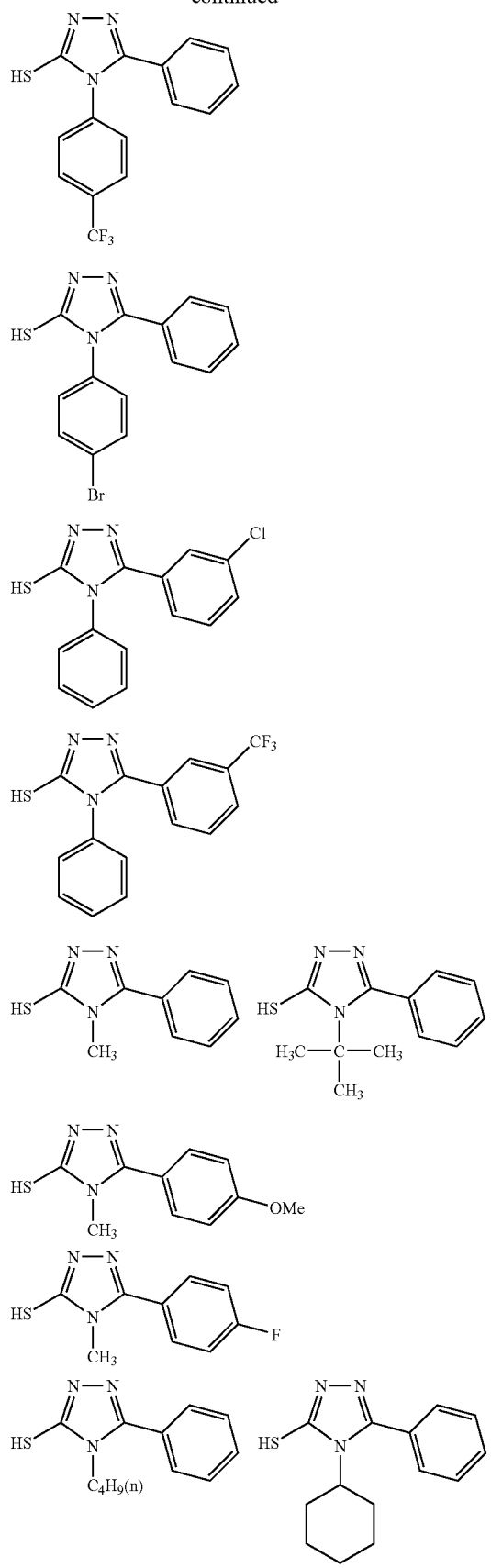
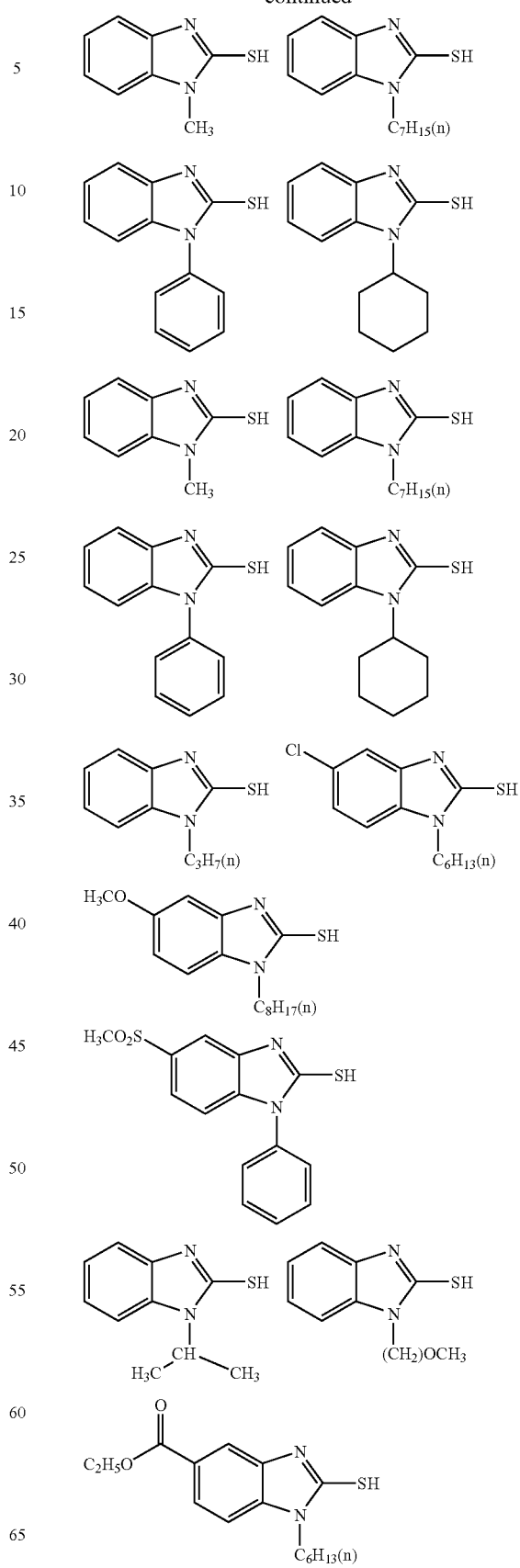

-continued

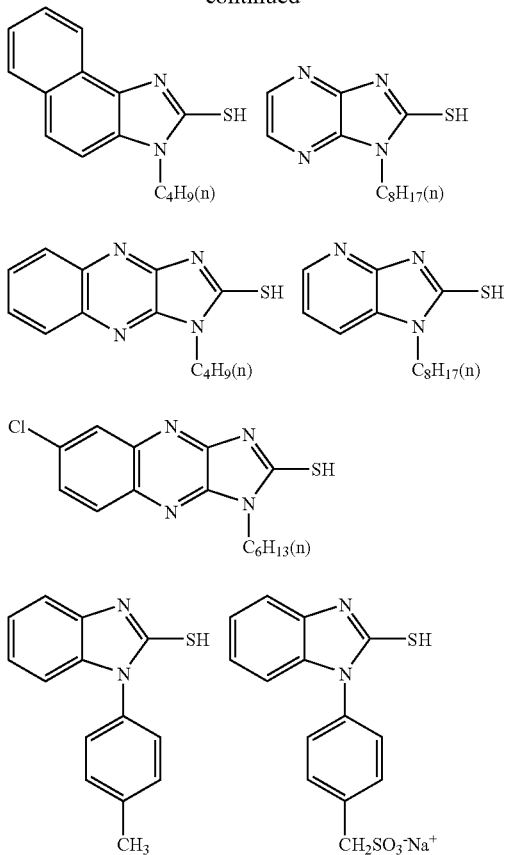

An amount of the chain transfer agent (for example, the thiol compound) used is preferably from 0.01 to 20% by weight, more preferably from 0.1 to 15% by weight, and still more preferably from 1.0 to 10% by weight, based on the total solid content of the photosensitive layer.

(F) Co-Sensitizer

In the invention, a co-sensitizer may be used. The co-sensitizer is an additive capable of further increasing the sensitivity of the photosensitive layer, when it is added to the photosensitive layer. The operation mechanism of the co-sensitizer is not quite clear but may be considered to be mostly based on the following chemical process. Specifically, the co-sensitizer reacts with various intermediate active species (for example, a radical, a peroxide, an oxidizing agent or a reducing agent) generated during the process of photo-reaction initiated by the photopolymerization initiation system and subsequent addition-polymerization reaction to produce new active radicals. The co-sensitizers are roughly classified into (a) a compound which is reduced to produce an active radical, (b) a compound which is oxidized to produce an active radical and (c) a compound which reacts with a radical having low activity to convert it into a more highly active radical or acts as a chain transfer agent. However, in many cases, a common view about that an individual compound belongs to which type is not present.

(a) Compound which is Reduced to Produce an Active Radical

Compound having Carbon-Halogen Bond:

An active radical is considered to be generated by the reductive cleavage of the carbon-halogen bond. Specific examples of the compound preferably used include a trihalomethyl-s-triazine and a trihalomethyloxadiazole.

Compound having Nitrogen-Nitrogen Bond:

An active radical is considered to be generated by the reductive cleavage of the nitrogen-nitrogen bond. Specific examples of the compound preferably used include a hexaarylbiimidazole.

Compound having Oxygen-Oxygen Bond:

An active radical is considered to be generated by the reductive cleavage of the oxygen-oxygen bond. Specific examples of the compound preferably used include an organic peroxide.

Onium Compound:

An active radical is considered to be generated by the reductive cleavage of a carbon-hetero bond or oxygen-nitrogen bond. Specific examples of the compound preferably used include a diaryliodonium salt, a triarylsulfonium salt and an N-alkoxypyridinium (azinium) salt.

(b) Compound which is Oxidized to Produce an Active Radical

Alkylate Complex:

An active radical is considered to be generated by the oxidative cleavage of a carbon-hetero bond. Specific examples of the compound preferably used include a triaryl alkyl borate.

Alkylamine Compound:

An active radical is considered to be generated by the oxidative cleavage of a C—X bond on the carbon adjacent to nitrogen, wherein X is preferably, for example, a hydrogen atom, a carboxyl group, a trimethylsilyl group or a benzyl group. Specific examples of the compound include an ethanolamine, an N-phenylglycine and an N-trimethylsilylmethylaniline.

Sulfur-Containing or Tin-Containing Compound:

A compound in which the nitrogen atom of the above-described amine is replaced by a sulfur atom or a tin atom is considered to generate an active radical in the same manner. Also, a compound having an S—S bond is known to effect sensitization by the cleavage of the S—S bond.

α-Substituted Methylcarbonyl Compound:

An active radical can be generated by the oxidative cleavage of carbonyl-α-carbon bond. The compound in which the carbonyl is converted into an oxime ether also shows the similar function. Specific examples of the compound include an 2-alkyl-1-[4-(alkylthio)phenyl]-2-morpholinopronone-1, an oxime ether obtained by a reaction of the 2-alkyl-1-[4-(alkylthio)phenyl]-2-morpholinopronone-1 with a hydroxyamine and subsequent etherification of the N—OH and an oxime ester obtained by a reaction of the 2-alkyl-1-[4-(alkylthio)phenyl]-2-morpholinopronone-1 with a hydroxyamine and subsequent esterification of the N—OH.

Sulfinic Acid Salt:

An active radical can be reductively generated. Specific examples of the compound include sodium arylsulfinate.

(c) Compound which Reacts with a Radical to Convert it into a More Highly Active Radical or Acts as a Chain Transfer Agent:

For example, a compound having SH, PH, SiH or GeH in its molecule is used as the compound which reacts with a radical to convert it into a more highly active radical or acts as a chain transfer agent. The compound donates hydrogen to a low active radical species to generate a radical or is oxidized and deprotonized to generate a radical. Specific examples of the compound include a 2-mercaptobenzimidazole.

Specific examples of the co-sensitizer include compounds described in JP-A-9-236913 as additives for the purpose of increasing sensitivity. Some of them are set forth below, but the invention should not be construed as being limited thereto.

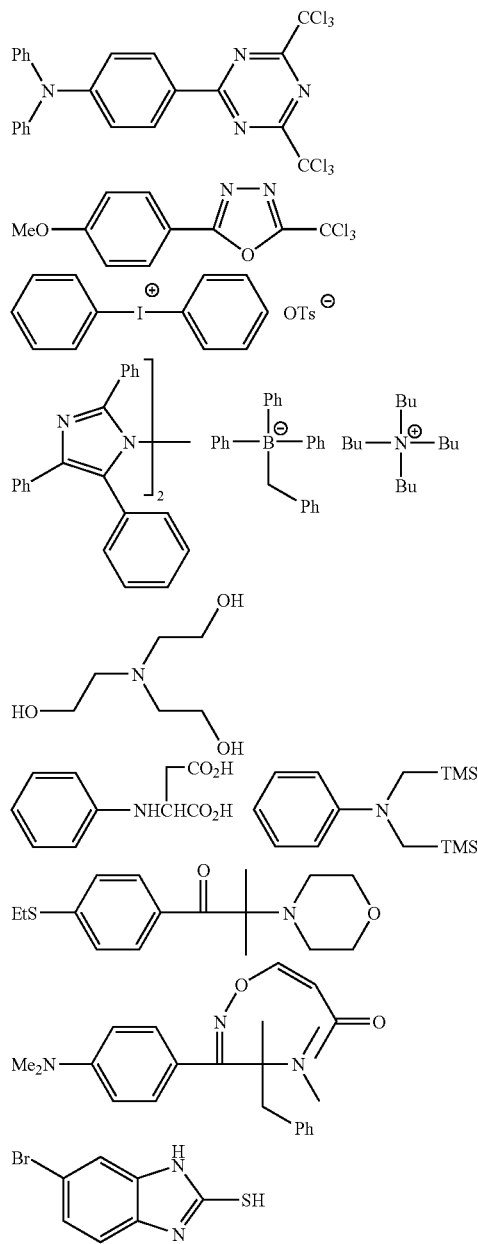

Similarly to the above-described sensitizing dye, the co-sensitizer can be subjected to various chemical modifications so as to improve the characteristics of the photosensitive layer of the lithographic printing plate precursor. For instance, methods, for example, binding to the sensitizing dye, polymerization initiator, addition-polymerizable unsaturated compound or other radical-generating part, introduction of a hydrophilic site, introduction of a substituent for improving compatibility or inhibiting deposition of crystal, introduction of a substituent for improving adhesion, and formation of a polymer, may be used. The co-sensitizers may be used individually or in combination of two or more thereof. The amount of the co-sensitizer used is ordinarily from 0.05 to 100 parts by weight, preferably from 1 to 80 parts by weight, and more preferably from 3 to 50 parts by weight, per 100 parts by weight of the polymerizable compound having an ethylenically unsaturated double bond.

<Microcapsule>

In the invention, in order to incorporate the above-described constituting components of the photosensitive layer and other constituting components described hereinafter into the photosensitive layer, a part or whole of the constituting components is encapsulated into microcapsules and added to the photosensitive layer as described, for example, in JP-A-2001-277740 and JP-A-2001-277742. In such a case, each constituting component may be present inside or outside the microcapsule in an appropriate ratio.

As a method of microencapsulating the constituting components of the photosensitive layer, known methods can be used. Methods for the production of microcapsules include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by polymerization of monomer described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and particularly polyurea and polyurethane are preferred. Further, a compound having a crosslinkable functional group, for example, an ethylenically unsaturated bond, capable of being introduced into the hydrophobic binder polymer described above may be introduced into the microcapsule wall.

An average particle size of the microcapsule is preferably from 0.01 to 3.0 µm, more preferably from 0.05 to 2.0 µm, and particularly preferably from 0.10 to 1.0 µm. In the above-described range, preferable resolution and good preservation stability can be achieved.

<Other Constituting Components of Photosensitive Layer>

Into the photosensitive layer according to the invention, various additives can further be incorporated, if desired. Such additives are described in detail below.

<Surfactant>

In the invention, it is preferred to use a surfactant in the photosensitive layer in order to progress the developing property and to improve the state of surface coated. The surfactant includes, for example, a nonionic surfactant, an anionic surfactant, a cationic surfactant, an amphoteric surfactant and a fluorine-based surfactant. The surfactants may be used individually or in combination of two or more thereof.

The nonionic surfactant used in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols, and copolymers of polyethylene glycol and polypropylene glycol.

The anionic surfactant used in the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and cationic surfactants hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferred surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants may be used individually or in combination of two or more thereof.

A content of the surfactant is preferably from 0.001 to 10% by weight, more preferably from 0.01 to 7% by weight, based on the total solid content of the photosensitive layer.

<Hydrophilic Polymer>

In the invention, a hydrophilic polymer may be incorporated into the photosensitive layer in order to improve the developing property and dispersion stability of microcapsule.

Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinylpyrrolidone, a homopolymer or polymer of acrylamide, a homopolymer or copolymer of methacrylamide, a homopolymer or copolymer of N-methylolacrylamide, polyvinylpyrrolidone, an alcohol-soluble nylon, and a polyether of 2,2-bis(4-hydroxyphenyl)propane with epichlorohydrin.

The hydrophilic polymer preferably has a weight average molecular weight of 5,000 or more, more preferably from 10,000 to 300,000. The hydrophilic polymer may be any of a random polymer, a block polymer, a graft polymer or the like.

The content of the hydrophilic polymer in the photosensitive layer is preferably 20% by weight or less, more preferably 10% by weight or less, based on the total solid content of the photosensitive layer.

<Coloring Agent>

In the invention, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Also, a pigment, for example, phthalocyanine-based pigment, azo-based pigment, carbon black and titanium oxide can be preferably used.

It is preferable to add the coloring agent, because the image area and the non-image area after the image formation can be easily distinguished. The amount of the coloring agent added is preferably from 0.01 to 10% by weight based on the total solid content of the photosensitive layer.

<Print-Out Agent>

In the photosensitive layer according to the invention, a compound capable of undergoing discoloration by the effect of an acid or a radical can be added in order to form a print-out image. As such a compound, for example, various dyes, e.g., diphenylmethane-based, triphenylmethane-based, thiazine-based, oxazine-based, xanthene-based, anthraquinone-based, iminoquinone-based, azo-based and azomethine-based dyes are effectively used.

Specific examples thereof include dyes, for example, Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH (produced by Hodogaya Chemical Co., Ltd.), Oil Blue #603 (produced by Orient Chemical Industry Co., Ltd.), Oil Pink #312 (produced by Orient Chemical Industry Co., Ltd.), Oil Red 5B (produced by Orient Chemical Industry Co., Ltd.), Oil Scarlet #308 (produced by Orient Chemical Industry Co., Ltd.), Oil Red OG (produced by Orient Chemical Industry Co., Ltd.), Oil Red RR (produced by Orient Chemical Industry Co., Ltd.), Oil Green #502 (produced by Orient Chemical Industry Co., Ltd.), Spiron Red BEH Special (produced by Hodogaya Chemical Co., Ltd.), m-Cresol Purple, Cresol Red, Rhodamine B, Rhodamine 6G, Sulforhodamine B, Auramine, 4-p-diethyl-aminophenyliminonaphthoquinone, 2-carboxyanilino-4-p-diethylaminophenyliminonaphthoquinone, 2-carboxystearyl-amino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes, for example, p,p',p"-hexamethyltriaminotriphenyl methane (leuco Crystal Violet) and Pergascript Blue SRB (produced by Ciba Geigy).

Other preferable examples include leuco dyes known as a material for heat-sensitive paper or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye capable of undergoing discoloration by the effect of an acid or a radical is preferably added in an amount of 0.01 to 15% by weight based on the total solid content of the photosensitive layer.

<Polymerization Inhibitor>

In the photosensitive layer according to the invention, a small amount of a thermal polymerization inhibitor is preferably added in order to prevent the radical polymerizable compound from undergoing undesirable thermal polymerization during the preparation or preservation of the photosensitive layer.

Preferable examples of the thermal polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the photosensitive layer.

<Higher Fatty Acid Derivative>

In the photosensitive layer according to the invention, for example, a higher fatty acid derivative, e.g., behenic acid or behenic acid amide may be added and localized on the surface of the photosensitive layer during the process of drying after coating in order to avoid polymerization inhibition due to oxygen. The amount of the higher fatty acid derivative added is preferably from about 0.1 to about 10% by weight based on the total solid content of the photosensitive layer.

<Plasticizer>

The photosensitive layer according to the invention may contain a plasticizer. Preferable examples of the plasticizer include a phthalic acid ester, for example, dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate; a glycol ester, for example, dimethyl glycol phthalate, ethyl phthalylethyl glycolate, methyl phthalylethyl glycolate, butyl phthalylbutyl glycolate or triethylene glycol dicaprylic acid ester; a phosphoric acid ester, for example, tricresyl phosphate or triphenyl phosphate; an aliphatic dibasic acid ester, for example, diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate. The content of the plasticizer is preferably about 30% by weight or less based on the total solid content of the photosensitive layer.

<Fine Inorganic Particle>

The photosensitive layer according to the invention may contain fine inorganic particle in order to increase strength of the hardened layer in the image area. The fine inorganic particle preferably includes, for example, silica, alumina, magnesium oxide, titanium oxide, magnesium carbonate, calcium alginate and a mixture thereof. Even if the fine inorganic particle has no light to heat converting property, it can be used, for example, for strengthening the layer or enhancing interface adhesion property due to surface roughening. The fine inorganic particle preferably has an average particle size from 5 nm to 10 μm and more preferably from 0.5 to 3 μm. In the above-described range, it is stably dispersed in the photosensitive layer, sufficiently maintains the film strength of the photosensitive layer and can form the non-image area excellent in hydrophilicity and preventing from stain at the printing.

The fine inorganic particle described above is easily available as a commercial product, for example, colloidal silica dispersion.

The content of the fine inorganic particle is preferably 20% by weight or less, and more preferably 10% by weight or less based on the total solid content of the photosensitive layer.

<Hydrophilic Low Molecular Weight Compound>

The photosensitive layer according to the invention may contain a hydrophilic low molecular weight compound in order to improve the developing property. The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, an organic carboxylic acid, e.g., tartaric acid, oxalic acid, citric acid, maleic acid, lactic acid, gluconic acid or an amino acid, or a salt thereof, and an organic quaternary ammonium salt, e.g., tetraethyl ammonium hydrochloride.

<Formation of Photosensitive Layer>

The photosensitive layer according to the invention is formed by dispersing or dissolving each of the necessary constituting components described above to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

The photosensitive layer according to the invention may also be formed by preparing plural coating solutions by dispersing or dissolving the same or different components described above into the same or different solvents and conducting repeatedly plural coating and drying.

The coating amount (solid content) of the photosensitive layer on the support after the coating and drying may be varied depending on the use, but ordinarily, it is preferably from 0.3 to 3.0 g/m². In the above-described range, the preferable sensitivity and good film property of the photosensitive layer can be obtained.

Various methods can be used for the coating. Examples of the method include bar coater coating, spin coating, spray coating, curtain coating, dip coating, air knife coating, blade coating and roll coating.

(Protective Layer)

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. The protective layer for use in the invention preferably has oxygen permeability (A) at 25° C. under one atmosphere of $1.0 \leq (A) \leq 20$ (ml/m²·day). When the oxygen permeability (A) is extremely lower than 1.0 (ml/m²·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m²·day), decrease in sensitivity may be incurred. The oxygen permeability (A) is more preferably in a range of $1.5 \leq (A) \leq 12$ (ml/m²·day), and still more preferably in a range of $2.0 \leq (A) \leq 10.0$ (ml/m²·day). Besides the above described oxygen permeability, as for the characteristics required of the protective layer, it is desired that the protective layer does not substantially hinder the transmission of light for the exposure, is excellent in adhesion to the photosensitive layer, and can be easily removed during a development step after the exposure. Contrivances on the protective layer have been heretofore made and described in detail in U.S. Pat. No. 3,458,311 and JP-B-55-49729.

As the material of the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of polyvinyl alcohol, those having a hydrolyzing rate of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (produced by Kuraray Co., Ltd.). They can be used individually or as a mixture. According to a preferred embodiment, the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, and more preferably from 15 to 30% by weight, in the protective layer.

The components of the protective layer (selection of PVA and use of additives) and the coating amount are determined taking into consideration fogging property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the (co)polymer, for example, polyvinyl alcohol (PVA) is ordinarily from 2,000 to 10,000,000, and preferably from 20,000 to 3,000,000.

As other additive of the protective layer, glycerin, dipropylene glycol or the like can be added in an amount corresponding to several % by weight of the (co)polymer to provide flexibility. Further, an anionic surfactant, for example, sodium alkylsulfate or sodium alkylsulfonate; an amphoteric surfactant, for example, alkylaminocarboxylate and alkylaminodicarboxylate; or a nonionic surfactant, for example, polyoxyethylene alkyl phenyl ether can be added in an amount corresponding to several % by weight of the (co) polymer.

The adhesion property of the protective layer to the photosensitive layer and scratch resistance are also extremely important in view of handling of the printing plate precursor. Specifically, when a hydrophilic layer comprising a water-soluble polymer is laminated on a oleophilic photosensitive layer, layer peeling due to insufficient adhesion is liable to occur, and the peeled portion causes such a defect as failure in hardening of the photosensitive layer due to polymerization inhibition by oxygen. Various proposals have been made for improving the adhesion between the photosensitive layer and the protective layer. For example, it is described in U.S. patent application Ser. Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of photosensitive layer.

The inorganic stratiform compound used here is a particle having a thin tabular shape and includes, for instance, mica, for example, natural mica represented by the following formula: A $(B, C)_{2-5} D_4 O_{10} (OH, F, O)_2$, (wherein A represents any one of K, Na and Ca, B and C each represents any one of Fe (II), Fe (III), Mn, Al, Mg and V, and D represents Si or Al) or synthetic mica; talc represented by the following formula: $3MgO.4SiO.H_2O$; teniolite; montmorillonite; saponite; hectolite; and zirconium phosphate.

Of the micas, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li_{1/8}(Si_4O_{10})F_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Na^+$, $Ca^{2+}$ or $Mg^{2+}$, is adsorbed between the lattice layers. The cation existing between the lattice layers is referred to as an exchangeable cation and is exchangeable with various cations. In particular, in the case where the cation between the lattice layers is $Li+$ or $Na^+$, because of a small ionic radius, a bond between the stratiform crystal lattices is week, and the inorganic stratiform compound greatly swells upon contact with water. When share is applied under such condition, the stratiform crystal lattices are easily cleaved to form a stable sol in water. The bentnite and swellable synthetic mica have strongly such tendency and are useful in the invention. Particularly, the swellable synthetic mica is preferably used.

With respect to the shape of the inorganic stratiform compound used in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, and particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 μm, preferably from 0.5 to 10 μm, and particularly preferably from 1 to 5 μm. An average thickness of the particle is ordinarily 0.1 μm or less, preferably 0.05 μm or less, and particularly preferably 0.01 μm or less. For example, in the swellable synthetic mica that is the representative compound of the inorganic stratiform compounds, thickness is approximately from 1 to 50 nm and plain size is approximately from 1 to 20 μm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/00 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferred inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand a grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added known additives, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble (meth)acrylic polymer can be added. Further, to the coating solution may be added known additives for increasing adhesion to the photosensitive layer or for improving preservation stability of the coating solution.

The coating solution for protective layer thus-prepared is coated on the photosensitive layer provided on the support and then dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

A coating amount of the protective layer is preferably in a range from 0.05 to 10 g/m$^2$ in terms of the coating amount after drying. When the protective layer contains the inorganic stratiform compound, it is more preferably in a range from 0.1 to 0.5 g/m$^2$, and when the protective layer does not contain the inorganic stratiform compound, it is more preferably in a range from 0.5 to 5 g/m$^2$.

[Support]

The support for use in the lithographic printing plate precursor according to the invention is not particularly restricted as long as it is a dimensionally stable plate-like hydrophilic support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the support is preferably from 0.1 to 0.6 mm, more preferably from 0.15 to 0.4 mm, and still more preferably from 0.2 to 0.3 mm.

Prior to the use of aluminum plate, a surface treatment, for example, roughening treatment or anodizing treatment is preferably performed. The surface treatment facilitates improvement in the hydrophilic property and ensures adhesion between the photosensitive layer and the support. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball grinding method, a brush grinding method, a blast grinding method or a buff grinding method can be used.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$ and more preferably from 1.5 to 4.0 g/m$^2$. In the above-described range, good printing durability and favorable scratch resistance in the non-image area of lithographic printing plate can be achieved.

The aluminum plate subjected to the surface treatment and having the anodized film is used as it is as the support in the invention. However, in order to more improve adhesion to a layer provided thereon, hydrophilicity, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with water vapor and a sealing treatment with hot water are preferred.

The hydrophilizing treatment includes an alkali metal silicate method described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461, and 4,689,272.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide. Among them, the hydrophilic layer formed by coating a coating solution containing a colloid of oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion of the hydrophilic layer to the support. As the antistatic layer, a polymer layer having fine particles of metal oxide or a matting agent dispersed therein described in JP-A-2002-79772 can be used.

The support preferably has a center line average roughness of 0.10 to 1.2 μm. In the above-described range, good adhesion to the photosensitive layer, good printing durability, and good stain resistance can be achieved.

The color density of the support is preferably from 0.15 to 0.65 in terms of the reflection density value. In the above-described range, good image-forming property by preventing halation at the image exposure and good aptitude for plate inspection after development can be achieved.

(Undercoat Layer)

In the lithographic printing plate precursor for use in the lithographic printing method according to the invention, an undercoat layer can be provided between the photosensitive layer and the support, if desired. It is advantageous that in the case of infrared laser exposure, since the undercoat layer acts as a heat insulating layer, heat generated upon the exposure does not diffuse into the support and is efficiently utilized so that increase in sensitivity can be achieved. Further, the undercoat layer makes removal of the photosensitive layer from the support in the unexposed area easy so that the on-machine development property can be improved.

As a compound for the undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are preferably exemplified.

As the most preferable compound for undercoat layer, a polymer resin obtained by copolymerization of a monomer having an adsorbing group, a monomer having a hydrophilic group and a monomer having a crosslinkable group is exemplified.

The essential component in the polymer undercoat layer is an adsorbing group to the hydrophilic surface of the support. Whether the adsorptivity to the hydrophilic surface of the support is present or not can be judged, for example, by the following method.

Specifically, a test compound is dissolved in a solvent in which the test compound is easily soluble to prepare a coating solution, and the coating solution is coated and dried on a support so as to have the coating amount after drying of 30 mg/m$^2$. After thoroughly washing the support coated with the test compound using the solvent in which the test compound is easily soluble, the residual amount of the test compound that has not been removed by the washing is measured to calculate the adsorption amount to the support. For measurement of the residual amount, the amount of the residual test compound may be directly determined, or it may be calculated from the amount of the test compound dissolved in the washing solution. The determination for the compound can be performed, for example, by fluorescent X-ray measurement, reflection spectral absorbance measurement or liquid chromatography measurement. The compound having the adsorptivity to support means a compound that remains by 1 mg/m$^2$ or more even after conducting the washing treatment described above.

The adsorbing group to the hydrophilic surface of the support is a functional group capable of forming a chemical bond (for example, an ionic bond, a hydrogen bond, a coordinate bond or a bond with intermolecular force) with a substance (for example, metal or metal oxide) or a functional group (for example, a hydroxy group) present on the surface of the support. The adsorbing group is preferably an acid group or a cationic group.

The acid group preferably has an acid dissociation constant (pKa) of 7 or less. Examples of the acid group include a phenolic hydroxy group, a carboxyl group, —SO$_3$H, —OSO$_3$H, —PO$_3$H$_2$, —OPO$_3$H$_2$, —CONHSO$_2$—, —SO$_2$NHSO$_2$— and —COCH$_2$COCH$_3$. Among them, —OPO$_3$H$_2$ and —PO$_3$H$_2$ are particularly preferred. The acid group may be the form of a metal salt.

The cationic group is preferably an onium group. Examples of the onium group include an ammonium group, a phosphonium group, an arsonium group, a stibonium group, an oxonium group, a sulfonium group, a selenonium group, a stannonium group and iodonium group. Among them, the ammonium group, phosphonium group and sulfonium group are preferred, the ammonium group and phosphonium group are more preferred, and the ammonium group is most preferred.

Particularly preferable examples of the monomer having the adsorbing group include compounds represented by the following formula (VII) or (VIII):

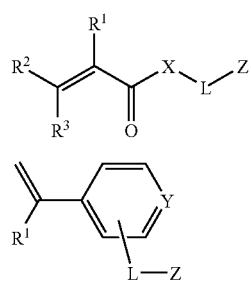

In formula (VII) or (VIII), R$^1$, R$^2$ and R$^3$ each independently represents a hydrogen atom, halogen atom or an alkyl group having from 1 to 6 carbon atoms. R$^1$ and R$^2$ and R$^3$ each independently represents preferably a hydrogen atom or an alkyl group having from 1 to 6 carbon atoms, more preferably a hydrogen atom or an alkyl group having from 1 to 3 carbon atoms, and most preferably a hydrogen atom or a methyl group. It is particularly preferred that R$^2$ and R$^3$ each represents a hydrogen atom.

In the formula (VII), X represents an oxygen atom (—O—) or imino group (—NH—). Preferably, X represents an oxygen atom. In the formula (VII) or (VIII), L represents a divalent connecting group. It is preferred that L represents a divalent aliphatic group (for example, an alkylene group, a substituted alkylene group, an alkenylene group, a substituted alkenylene group, an alkinylene group or a substituted alkinylene group), a divalent aromatic group (for example, an arylene group or a substituted arylene group), a divalent heterocyclic group or a combination of each of the groups described above with an oxygen atom (—O—), a sulfur atom (—S—), an imino group (—NH—), a substituted imino group (—NR—, wherein R represents an aliphatic group, an aromatic group or a heterocyclic group) or a carbonyl group (—CO—).

The aliphatic group may form a cyclic structure or a branched structure. The number of carbon atoms of the aliphatic group is preferably from 1 to 20, more preferably from 1 to 15, and most preferably from 1 to 10. It is preferred that the aliphatic group is a saturated aliphatic group rather than an unsaturated aliphatic group. The aliphatic group may have a substituent. Examples of the substituent include a halogen atom, a hydroxy group, an aromatic group and a heterocyclic group.

The number of carbon atoms of the aromatic group is preferably from 6 to 20, more preferably from 6 to 15, and most preferably from 6 to 10. The aromatic group may have a substituent. Examples of the substituent include a halogen atom, a hydroxy group, an aliphatic group, an aromatic group and a heterocyclic group.

It is preferred that the heterocyclic group has a 5-membered or 6-membered ring as the hetero ring. Other heterocyclic ring, an aliphatic ring or an aromatic ring may be condensed to the heterocyclic ring. The heterocyclic group may have a substituent. Examples of the substituent include a halogen atom, a hydroxy group, an oxo group (=O), a thioxo group (=S), an imino group (=NH), a substituted imino group (=N—R, where R represents an aliphatic group, an aromatic group or a heterocyclic group), an aliphatic group, an aromatic group and a heterocyclic group.

It is preferred that L represents a divalent connecting group containing a plurality of polyoxyalkylene structures. It is more preferred that the polyoxyalkylene structure is a polyoxyethylene structure. Specifically, it is preferred that L contains —(OCH$_2$CH$_2$)$_n$— (n is an integer of 2 or more).

In the formula (VII) or (VIII), Z represents a functional group adsorbing to the hydrophilic surface of the support. In the formula (VIII), Y represents a carbon atom or a nitrogen atom. In the case where Y is a nitrogen atom and L is connected to Y to form a quaternary pyridinium group, Z is not mandatory, because the quaternary pyridinium group itself exhibits the adsorptivity. The adsorptive functional group is the same as that described above.

Representative examples of the monomer represented by formula (VII) or (VIII) are set forth below.

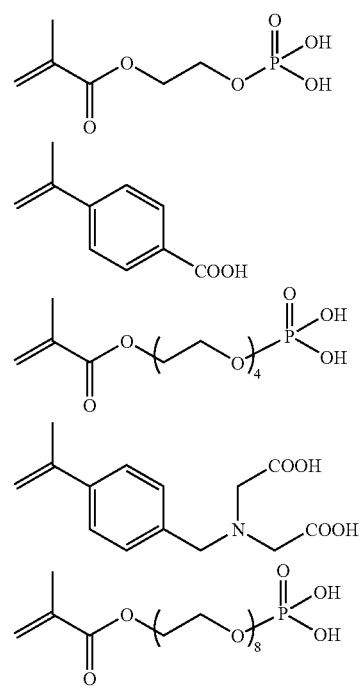

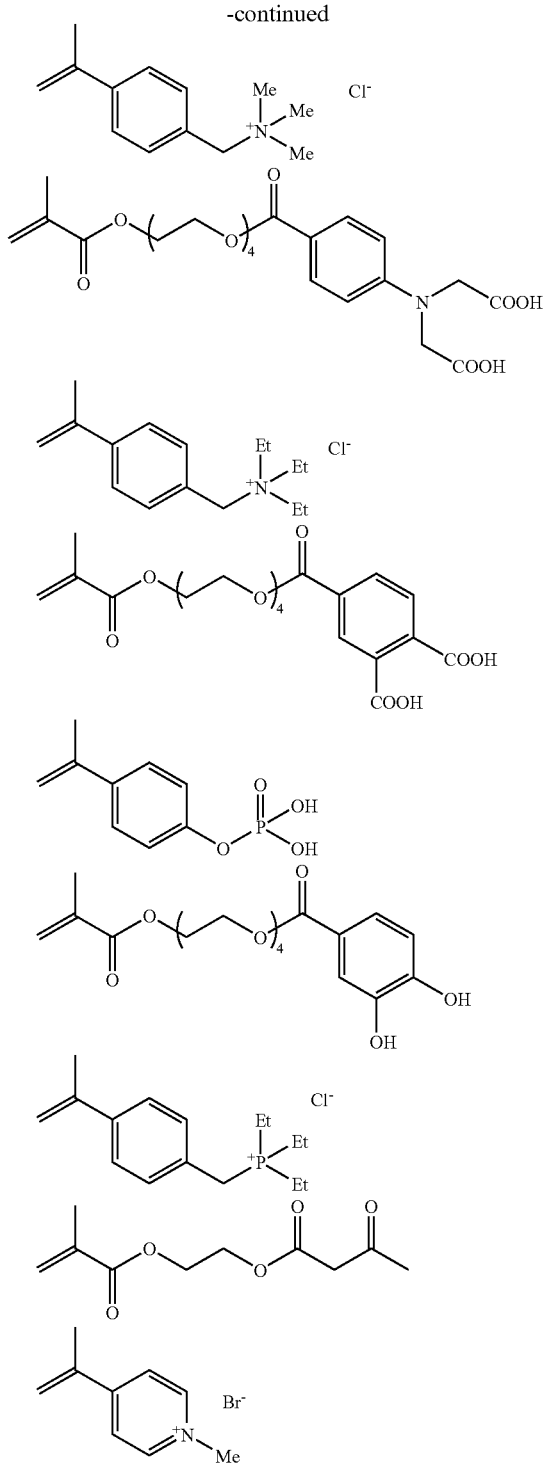

The hydrophilic group of the polymer resin for undercoat layer which can be used in the invention includes, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group. A monomer containing such a hydrophilic group and a polymerizable group is employed as a copolymerization component of the polymer resin for undercoat layer.

The polymer resin for undercoat layer which can be used in the invention preferably includes a crosslinkable group. By the crosslinkable group, increase in adhesion to the image area can be achieved. In order to impart the crosslinkable property to the polymer resin for the undercoat layer, introduction of a crosslinkable functional group, for example, an ethylenically unsaturated bond into the side chain of the polymer resin, or introduction by formation of a salt structure between a polar substituent of the polymer resin and a compound containing a substituent having a counter charge to the polar substituent of the polymer resin and an ethylenically unsaturated bond is carried out.

Examples of the polymer having an ethylenically unsaturated bond in the side chain thereof include a polymer of an ester or amide of acrylic acid or methacrylic acid, which is a polymer wherein the ester or amide residue (R in —COOR or —CONHR) has an ethylenically unsaturated bond.

Examples of the residue (R described above) having an ethylenically unsaturated bond include —$(CH_2)_n$CR$_1$=CR$_2$R$_3$, —$(CH_2O)_n$CH$_2$CR$_1$=CR$_2$R$_3$, —$(CH_2CH_2O)_n$CH$_2$CR$_1$=CR$_2$R$_3$, —$(CH_2)_n$NH—CO—O—CH$_2$CR$_1$=CCR$_2$R$_3$, —$(CH_2)_n$—O—CO—CR$_1$=CCR$_2$R$_3$ and —$(CH_2CH_2O)_2$—X (wherein $R_1$ to $R_3$ each independently represents a hydrogen atom, a halogen atom or an alkyl group having from 1 to 20 carbon atoms, an aryl group, alkoxy group or aryloxy group, or $R_1$ and $R_2$ or $R_1$ and $R_3$ may be combined with each other to form a ring. n represents an integer of 1 to 10. X represents a dicyclopentadienyl residue).

Specific examples of the ester residue include —CH$_2$CH=CH$_2$ (described in JP-B-7-21633) —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NHCOO—CH$_2$CH=CH$_2$ and —CH$_2$CH$_2$O—X (wherein X represents a dicyclopentadienyl residue).

Specific examples of the amide residue include —CH$_2$CH=CH$_2$, —CH$_2$CH$_2$O—Y (wherein Y represents a cyclohexene residue) and —CH$_2$CH$_2$—OCO—CH=CH$_2$.

As the monomer having a crosslinkable group for the polymer resin for the undercoat layer, an ester or amide of acrylic acid or methacrylic acid having the above-described crosslinkable group is preferable.

A content of the crosslinking group in the polymer resin for undercoat layer (content of the radical polymerizable unsaturated double bond determined by iodine titration) is preferably from 0.1 to 10.0 mmol, more preferably from 1.0 to 7.0 mmol, and most preferably from 2.0 to 5.5 mmol, based on 1 g of the polymer resin. In the above-described range, preferable compatibility between the sensitivity and stain resistance and good preservation stability can be achieved.

A weight average molecular weight of the polymer resin for undercoat layer is preferably 5,000 or more, more preferably from 10,000 to 300,000. A number average molecular weight of the polymer resin for undercoat layer is preferably 1,000 or more, more preferably from 2,000 to 250,000. The polydispersity (weight average molecular weight/number average molecular weight) thereof is preferably from 1.1 to 10.

The polymer resin for undercoat layer may be any of a random polymer, a block polymer and a graft polymer, and it is preferably a random polymer.

As the polymer resin for undercoat layer, known resins having a hydrophilic group can also be used. Specific examples of the resin include gum arabic, casein, gelatin, a starch derivative, carboxy methyl cellulose and a sodium salt thereof, cellulose acetate, sodium alginate, vinyl acetate-maleic acid copolymer, styrene-maleic acid copolymer, polyacrylic acid and a salt thereof, polymethacrylic acid and a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, a polyethylene glycol, a hydroxypropylene polymer, a polyvinyl alcohol, a hydrolyzed polyvinyl acetate having a hydrolysis degree of 60% by mole or more, preferably 80% by mole or more, a polyvinyl formal, a polyvinyl butyral, a polyvinyl pyrrolidone, a homopolymer or copolymer of acrylamide, a homopolymer or polymer of methacrylamide, a homopolymer or copolymer of N-methylolacrylamide, a polyvinyl pyrrolidone, an alcohol-soluble nylon, a polyether of 2,2-bis-(4-hydroxyphenyl)propane and epichlorohydrin.

The polymer resins for undercoat layer may be used individually or as a mixture of two or more thereof.

A coating amount (solid content) of the undercoat layer is preferably from 0.1 to 100 mg/m$^2$, and more preferably from 1 to 30 mg/m$^2$.

(Backcoat Layer)

After applying the surface treatment to the support or forming the undercoat layer on the support, a backcoat layer can be provided on the back surface of the support, if desired.

The backcoat layer preferably includes, for example, a coating layer comprising an organic polymer compound described in JP-A-5-45885, and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Plate-Making Method]

The lithographic printing plate precursor according to the invention is exposed imagewise by a light source of 350 to 450 nm, and then rubbed a surface of the exposed lithographic printing plate precursor with a rubbing member in the presence of a developer having pH of 2 to 10 in an automatic processor to remove the protective layer and the unexposed area of the photosensitive layer all at once, whereby an image can be formed on the surface of aluminum plate support.

Specifically, after removing the protective layer and the unexposed area of the photosensitive layer all at once, the resulting printing plate is immediately mounted on a printing machine to conduct printing.

The processing by the automatic processor in such a manner is advantageous in view of being free from the measures against development scum resulting from the protective layer and photosensitive layer encountered in case of on-machine development.

The developer for use in the invention is an aqueous solution having pH of 2 to 10. For instance, the developer is preferably water alone or an aqueous solution containing water as a main component (containing 60% by weight or more of water). Particularly, an aqueous solution having the same composition as conventionally known dampening water, an aqueous solution containing a surfactant (for example, an anionic, nonionic or cationic surfactant) and an aqueous solution containing a water-soluble polymer compound are preferable. An aqueous solution containing both a surfactant and a water-soluble polymer compound is especially preferable. The pH of the developer is preferably from 3 to 8, and more preferably from 4 to 7.

The concentration of the surfactant in the developer is ordinarily 1% by weight or more, preferably 2% by weight or more, and more preferably from 5 to 20% by weight or more.

The anionic surfactant for use in the developer according to the invention includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, dialkylsulfosuccinic acid salts, alkyl sulfate ester salts and alkylnaphthalenesulfonic acid salts are particularly preferably used.

The cationic surfactant for use in the developer according to the invention is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant for use in the developer according to the invention includes, for example, polyethylene glycol type higher alcohol ethylene oxide addacts, alkylphenol ethylene oxide addacts, fatty acid ethylene oxide addacts, polyhydric alcohol fatty acid ester ethylene oxide addacts, higher alkylamine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

The nonionic surfactants may be used individually or as a mixture of two or more thereof. In the invention, ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols are more preferable.

Further, from the standpoint of stable solubility in water or opacity, with respect to the nonionic surfactant used in the developer according to the invention, the HLB (hydrophile-lipophile balance) value thereof is preferably 6 or more, and more preferably 8 or more. Moreover, an amount of the nonionic surfactant contained in the developer is preferably from 0.01 to 10% by weight, and more preferably from 0.01 to 5% by weight.

Furthermore, an oxyethylene adduct of acetylene glycol type or acetylene alcohol type or a surfactant, for example, a fluorine-based surfactant or a silicon-based surfactant can also be used.

Of the surfactants used in the developer according to the invention, the nonionic surfactant is particularly preferred in view of foam depressing property.

Of the surfactants for use in the developer according to the invention, as the anionic surfactants, compounds represented by any one of formulae (III) to (VI) shown below are particularly preferable and as the nonionic or cationic surfactants containing a nitrogen atom, compounds represented by any one of formulae (VII) to (IX) shown below are particularly preferable.

The surfactants represented by any one of formulae (III) to (XI) shown below can be synthesized according to known methods. The molecular weight of the surfactant is ordinarily 2,000 or less, preferably from 100 to 1,500.

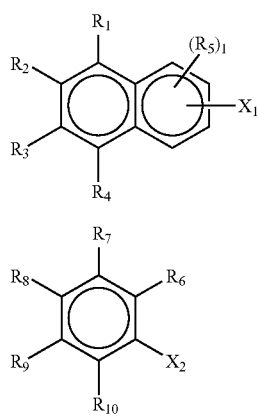

In formulae, $R_1$ to $R_{10}$ each represents a hydrogen atom or an alkyl group; 1 represents an integer of 1 to 3; $X_1$ and $X_2$ each represents a sulfonate, a sulfuric monoester salt, a carboxylate or a phosphate; and provided that a total number of carbon atoms included in $R_1$ to $R_5$ or $R_6$ to $R_{10}$ is 3 or more.

In the compound represented by formula (III), when the total number of carbon atoms included in $R_1$ to $R_5$ is 3 or more, the effect can be recognized. However, as the total number of carbon atoms included in $R_1$ to $R_5$ increases, the hydrophobic portion becomes large and dissolution of the compound in an aqueous developer becomes difficult. In such a case, the surfactant can not be dissolved in a proper mixing range even when a dissolution auxiliary agent for assisting the dissolution, for example, an organic solvent is mixed with water. Ordinarily, the total number of carbon atoms included in $R_1$ to $R_5$ is 24 or less. The total number of carbon atoms included in $R_1$ to $R_5$ is preferably from 3 to 20. When $R_1$ to $R_5$ represent one or more alkyl groups, each of the alkyl groups may be a straight-chain or branched structure.

The total number of carbon atoms included in $R_1$ to $R_5$ of the compound (surfactant) is influenced by a material, especially, a binder, used in the photosensitive layer. When a binder having high hydrophilicity is used, the total number of carbon atoms included in $R_1$ to $R_5$ may be relatively small. On the other hand, when a binder having low hydrophilicity is used, it is necessary that the total number of carbon atoms included in $R_1$ to $R_5$ is large.

In the above-described compound, $X_1$ represents a sulfonate, a sulfuric monoester salt, a carboxylate or a phosphate. Among them, the sulfonate and carboxylate have the large effect. In the salts, an alkali metal salt is preferable, since it has excellent solubility in an aqueous solvent. Among them, a sodium salt or a potassium salt is particularly preferable.

The compound will be described more specifically below.

Specific examples of the compound wherein the alkyl groups represented by $R_1$ to $R_5$ do not contain an oxygen atom are set forth below.

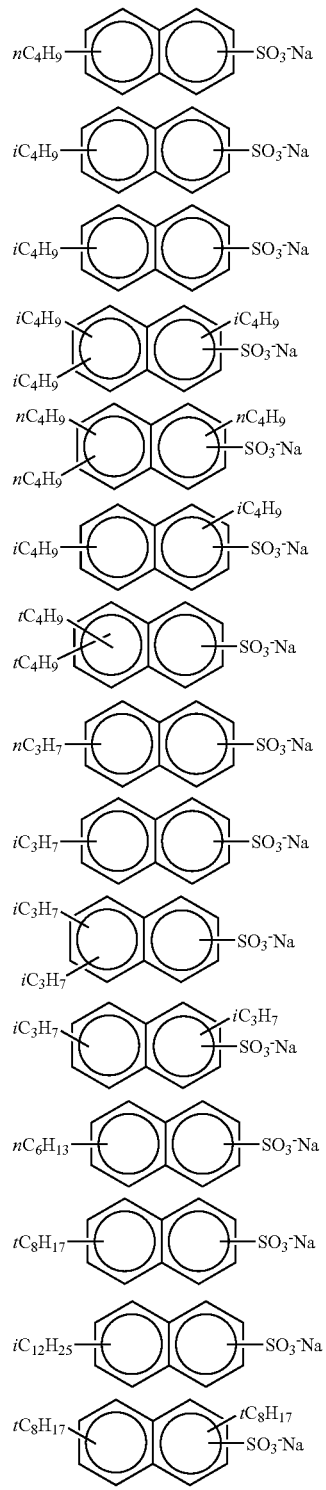

-continued

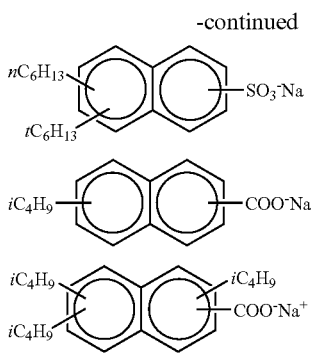

Specific examples of the compound represented by formula (III) wherein at least one of $R_1$ to $R_5$ represents an alkyl group containing an oxygen atom, that is, —$C_mH_{2m}OC_{n-m}H_{2(n-m)+1}$ ($n \geq 2$, $n \geq m \geq 0$) are set forth below.

The substituents other than the —$C_mH_{2m}OC_{n-m}H_{2(n-m)+1}$ are hydrogen atoms or alkyl groups, and the total number of carbon atoms included in $R_1$ to $R_5$ is 3 to 24. These compounds are easily soluble in the aqueous solvent by the introduction of oxygen atom and they are preferably used in the developer in many cases.

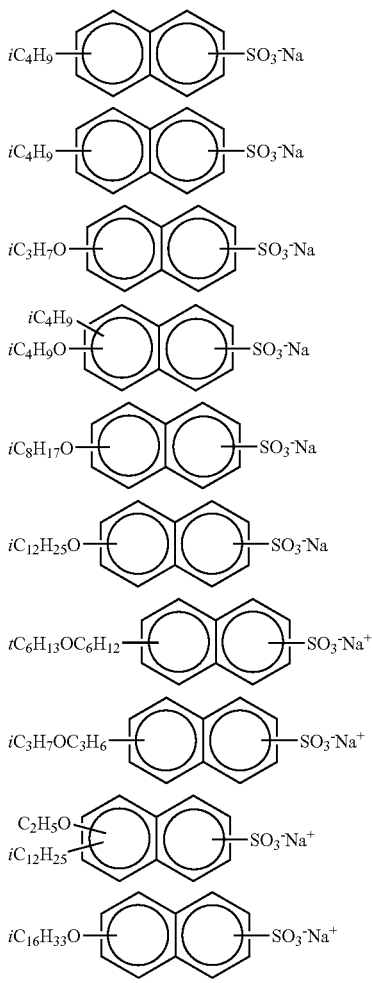

-continued

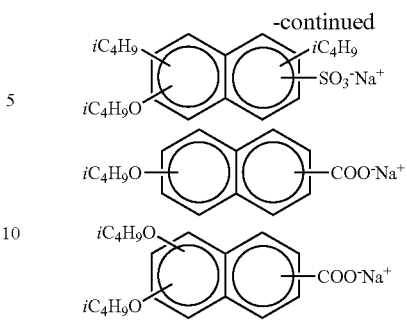

In the compound represented by formula (IV), when the total number of carbon atoms included in $R_6$ to $R_{10}$ is 3 or more, the effect can be recognized. However, as the total number of carbon atoms included in $R_6$ to $R_{10}$ increases, the hydrophobic portion becomes large and dissolution of the compound in an aqueous developer becomes difficult. In such a case, the surfactant can not be dissolved in a proper mixing range even when a dissolution auxiliary agent for assisting the dissolution, for example, an organic solvent is mixed with water. Ordinarily, the total number of carbon atoms included in $R_6$ to $R_{10}$ is 24 or less. The total number of carbon atoms included in $R_6$ to $R_{10}$ is preferably from 3 to 20. When $R_6$ to $R_{10}$ represents one or more alkyl groups, each of the alkyl groups may be a straight-chain or branched structure.

The total number of carbon atoms included in $R_6$ to $R_{10}$ of the compound (surfactant) is influenced by a material, especially, a binder, used in the photosensitive layer. When a binder having high hydrophilicity is used, the total number of carbon atoms included in $R_6$ to $R_{10}$ may be relatively small. On the other hand, when a binder having low hydrophilicity is used, it is necessary that the total number of carbon atoms included in $R_6$ to $R_{10}$ is large.

In the above-described compound, $X_2$ represents a sulfonate, a sulfuric monoester salt, a carboxylate or a phosphate. Among them, the sulfonate and carboxylate have the large effect. In the salts, an alkali metal salt is preferable, since it has excellent solubility in an aqueous solvent. Among them, a sodium salt or a potassium salt is particularly preferable.

The compound will be described more specifically below.

Specific examples of the compound wherein the alkyl groups represented by $R_6$ to $R_{10}$ do not contain an oxygen atom are set forth below.

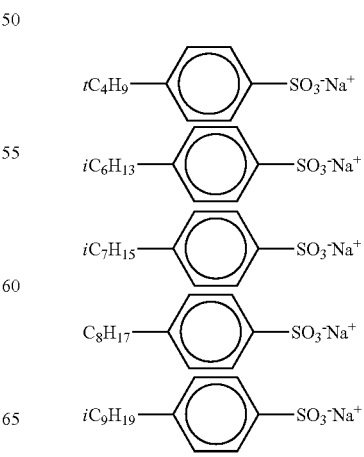

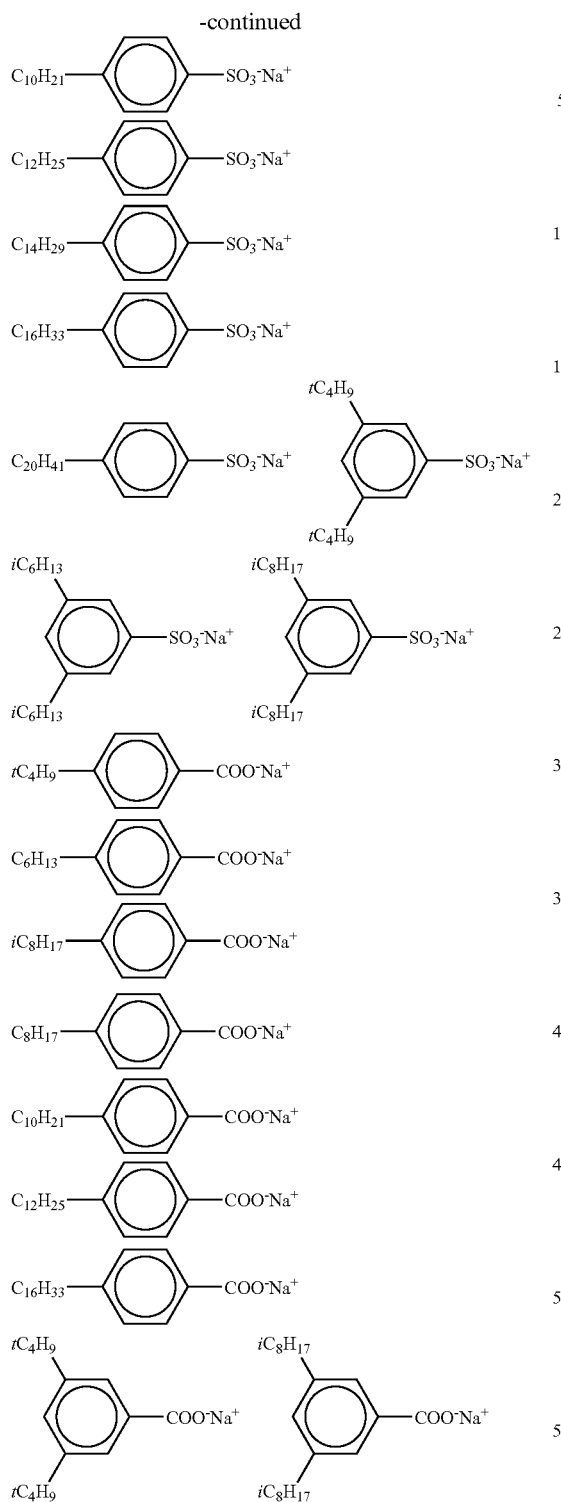

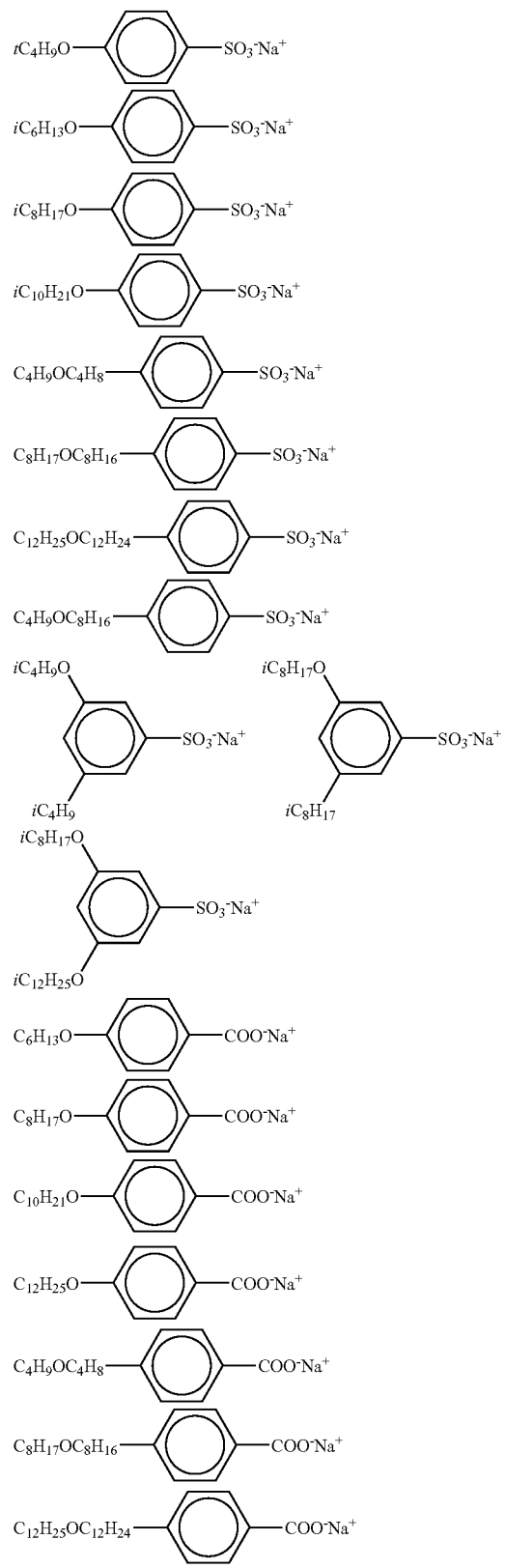

pounds are easily soluble in the aqueous solvent by the introduction of oxygen atom and they are preferably used in the developer in many cases.

Specific examples of the compound wherein at least one of $R_6$ to $R_{10}$ represents an alkyl group containing an oxygen atom, that is, $-C_mH_{2m}OC_{n-m}H_{2(n-m)+1}$ ($n \geqq 2$, $n \geqq m \geqq 0$) are set forth below.

The substituents other than the $-C_mH_{2m}OC_{n-m}H_{2(n-m)+1}$ are hydrogen atoms or alkyl groups, and the total number of carbon atoms included in $R_6$ to $R_{10}$ is 3 to 24. These com-

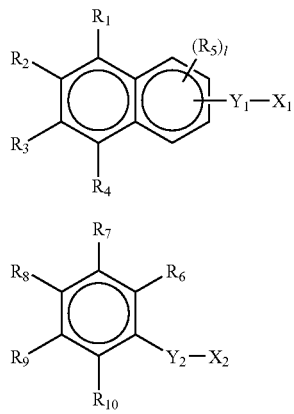

In the formulae, $R_1$ to $R_{10}$ each represents a hydrogen atom or an alkyl group; l represents an integer of 1 to 3; $X_1$ and $X_2$ each represents a sulfonate, a sulfuric monoester salt, a carboxylate or a phosphate; $Y_1$ and $Y_2$ each represents $-C_nH_{2n}-$, $-C_{n-m}H_{2(n-m)}OC_mH_{2m}-$, $-O-(CH_2CH_2O)_n-$, $-O-(CH_2CH_2CH_2O)_n-$ or $-CO-NH-$ wherein $n \geqq 1$ and $n \geqq m \geqq 0$; and provided that a total number of carbon atoms included in $R_1$ to $R_5$ and $Y_1$ or $R_6$ to $R_{10}$ and $Y_2$ is 3 or more.

In the compound represented by formula (V), when the total number of carbon atoms included in $R_1$ to $R_5$ and $Y_1$ is 3 or more, the effect can be recognized. However, as the total number of carbon atoms increases, the hydrophobic portion becomes large and dissolution of the compound in an aqueous developer becomes difficult. In such a case, the surfactant can not be dissolved in a proper mixing range even when a dissolution auxiliary agent for assisting the dissolution, for example, an organic solvent is mixed with water. Ordinarily, the total number of carbon atoms is 25 or less. The total number of carbon atoms is preferably from 4 to 20. The alkyl group described above may be a straight-chain or branched structure.

The total number of carbon atoms included in $R_1$ to $R_5$ and $Y_1$ of the compound (surfactant) is influenced by a material, especially, a binder, used in the photosensitive layer. When a binder having high hydrophilicity is used, the total number of carbon atoms included in $R_1$ to $R_5$ and $Y_1$ may be relatively small. On the other hand, when a binder having low hydrophilicity is used, it is necessary that the total number of carbon atoms is large.

In the above-described compound, $X_1$ represents a sulfonate, a sulfuric monoester salt, a carboxylate or a phosphate. Among them, the sulfonate and carboxylate have the large effect. In the salts, an alkali metal salt is preferable, since it has excellent solubility in an aqueous solvent. Among them, a sodium salt or a potassium salt is particularly preferable.

The compound will be described more specifically below.

Specific examples of the compound wherein $Y_1$ represents a group not containing an oxygen atom are set forth below.

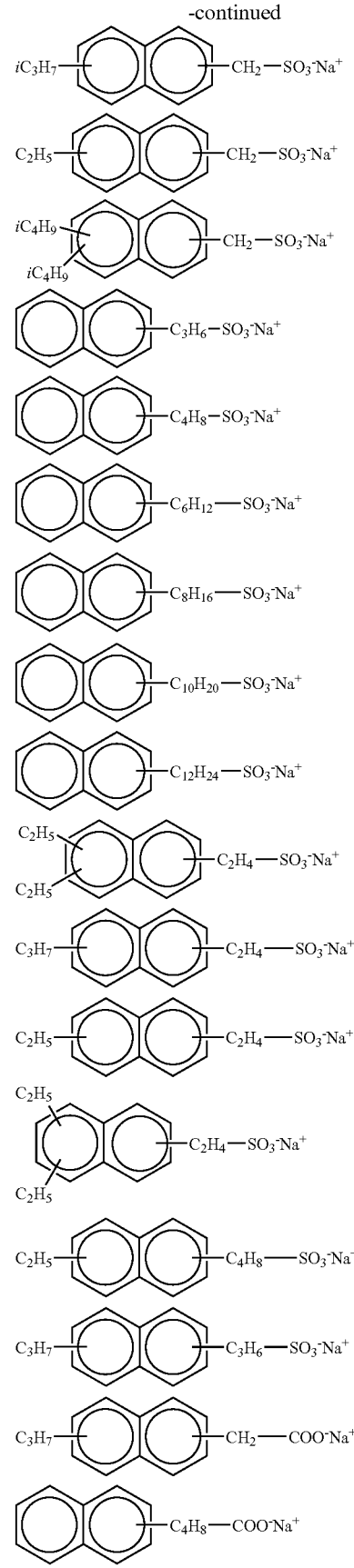

-continued

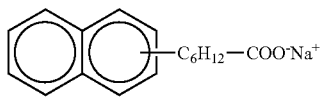

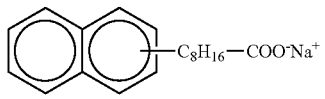

Specific examples of the compound wherein $Y_1$ represents a group containing an oxygen atom, that is, $-C_{n-m}H_{2(n-m)}OC_mH_{2m}-$ ($n \geq 1$, $n \geq m \geq 0$) are set forth below.

The substituents ($R_1$ to $R_5$) other than the $-C_{n-m}H_{2(n-m)}OC_mH_{2m}-$ are hydrogen atoms or alkyl groups, and the total number of carbon atoms is 3 to 25. These compounds are easily soluble in the aqueous solvent by the introduction of oxygen atom and they are preferably used in the developer in many cases.

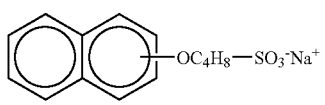

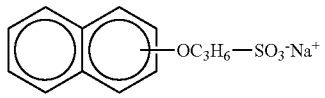

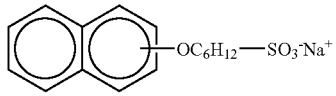

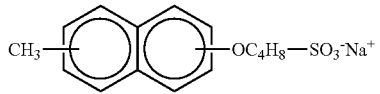

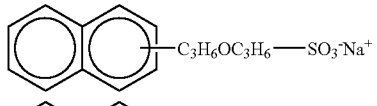

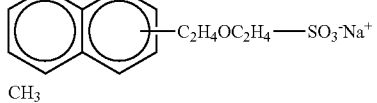

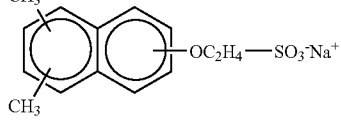

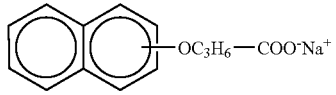

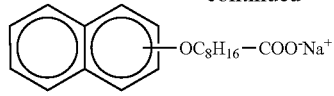

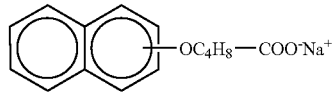

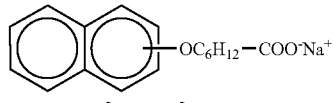

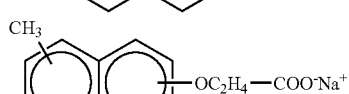

In the compound represented by formula (VI), when the total number of carbon atoms included in $R_6$ to $R_{10}$ and $Y_2$ is 3 or more, the effect can be recognized. However, as the total number of carbon atoms increases, the hydrophobic portion becomes large and dissolution of the compound in an aqueous developer becomes difficult. In such a case, the surfactant can not be dissolved in a proper mixing range even when a dissolution auxiliary agent for assisting the dissolution, for example, an organic solvent is mixed with water. Ordinarily, the total number of carbon atoms is 25 or less. The total number of carbon atoms is preferably from 3 to 20. The alkyl group described above may be a straight-chain or branched structure.

The total number of carbon atoms included in $R_6$ to $R_{10}$ and $Y_2$ of the compound (surfactant) is influenced by a material, especially, a binder, used in the photosensitive layer. When a binder having high hydrophilicity is used, the total number of carbon atoms included in $R_6$ to $R_{10}$ and $Y_2$ may be relatively small. On the other hand, when a binder having low hydrophilicity is used, it is necessary that the total number of carbon atoms is large.

In the above-described compound, $X_2$ represents a sulfonate, a sulfuric monoester salt, a carboxylate or a phosphate. Among them, the sulfonate and carboxylate have the large effect. In the salts, an alkali metal salt is preferable, since it has excellent solubility in an aqueous solvent. Among them, a sodium salt or a potassium salt is particularly preferable.

The compound will be described more specifically below.

Specific examples of the compound wherein $Y_2$ represents a group not containing an oxygen atom are set forth below.

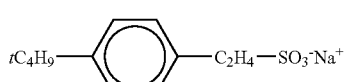

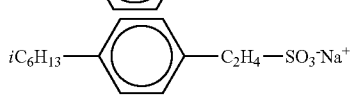

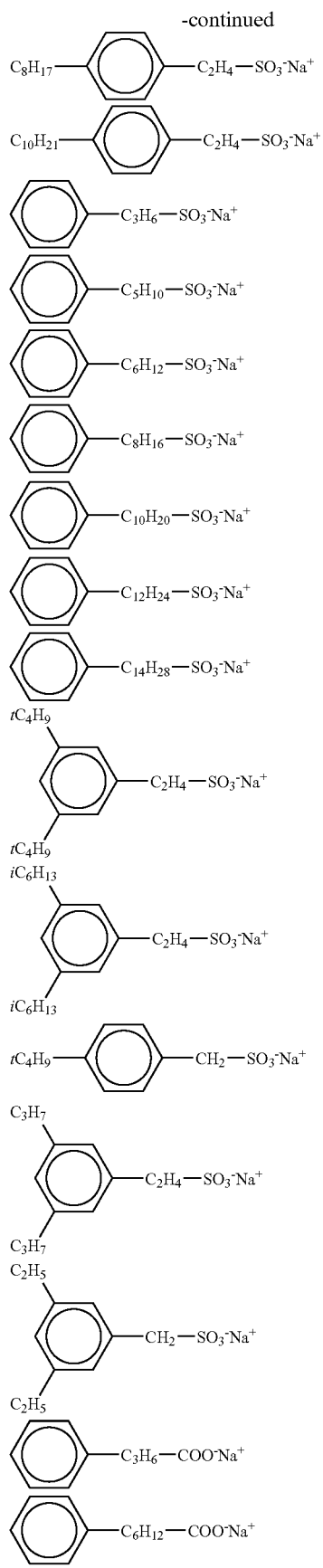
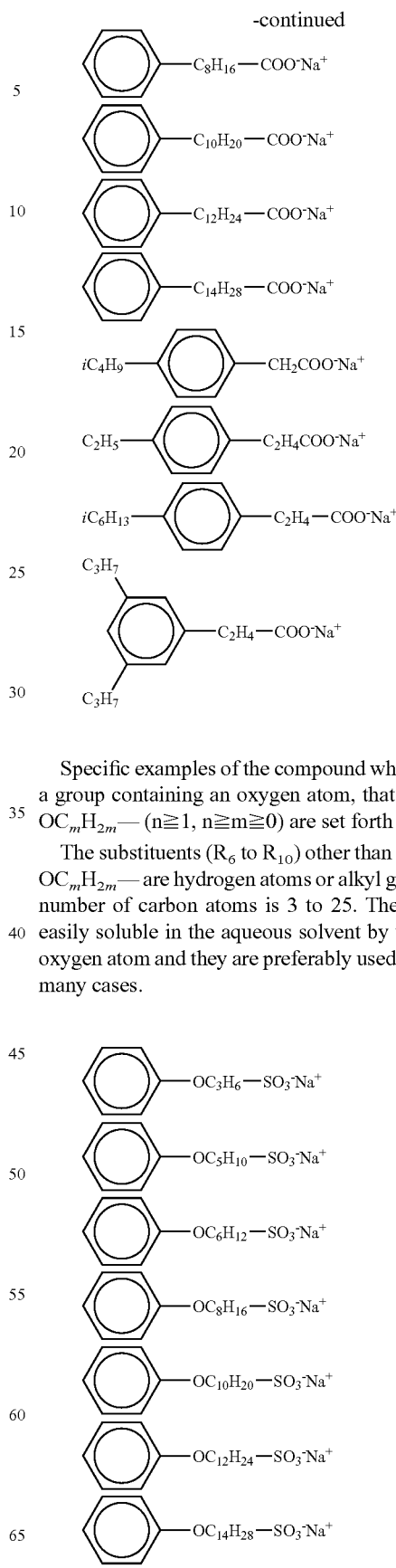

Specific examples of the compound wherein $Y_2$ represents a group containing an oxygen atom, that is, $-C_{n-m}H_{2(n-m)}OC_mH_{2m}-$ ($n \geq 1$, $n \geq m \geq 0$) are set forth below.

The substituents ($R_6$ to $R_{10}$) other than the $-C_{n-m}H_{2(n-m)}OC_mH_{2m}-$ are hydrogen atoms or alkyl groups, and the total number of carbon atoms is 3 to 25. These compounds are easily soluble in the aqueous solvent by the introduction of oxygen atom and they are preferably used in the developer in many cases.

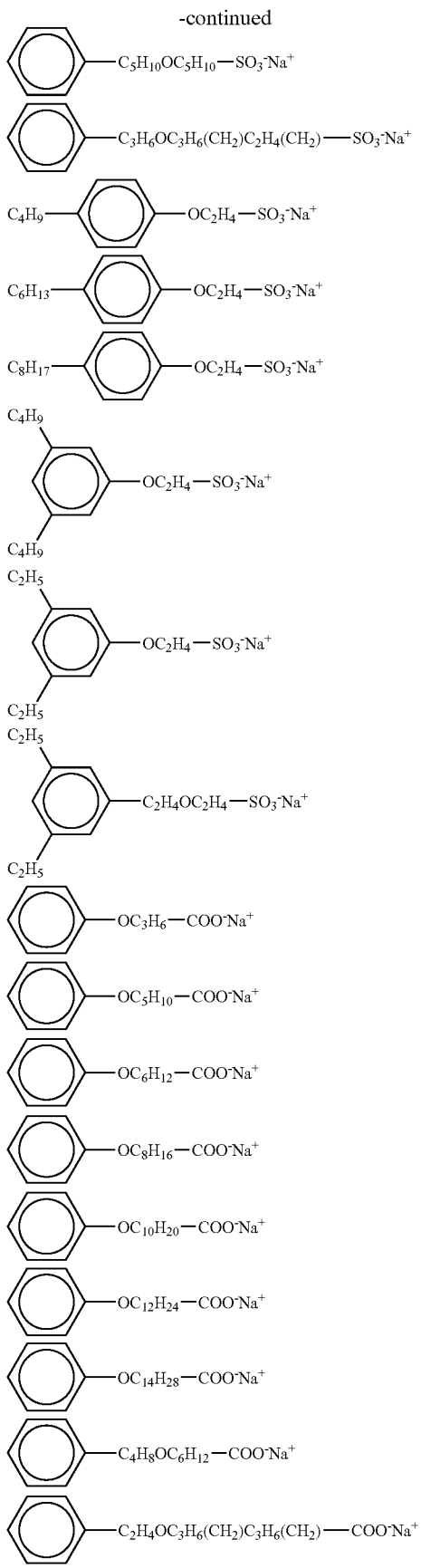
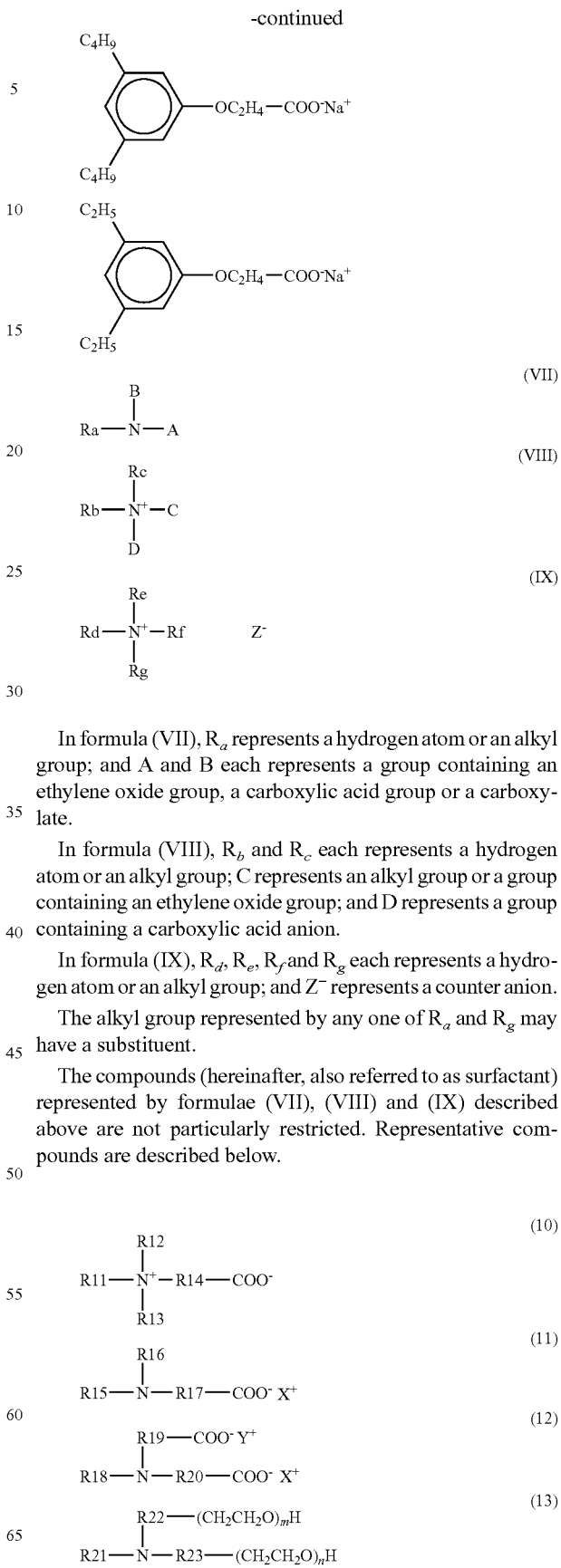

In formula (VII), $R_a$ represents a hydrogen atom or an alkyl group; and A and B each represents a group containing an ethylene oxide group, a carboxylic acid group or a carboxylate.

In formula (VIII), $R_b$ and $R_c$ each represents a hydrogen atom or an alkyl group; C represents an alkyl group or a group containing an ethylene oxide group; and D represents a group containing a carboxylic acid anion.

In formula (IX), $R_d$, $R_e$, $R_f$ and $R_g$ each represents a hydrogen atom or an alkyl group; and $Z^-$ represents a counter anion.

The alkyl group represented by any one of $R_a$ and $R_g$ may have a substituent.

The compounds (hereinafter, also referred to as surfactant) represented by formulae (VII), (VIII) and (IX) described above are not particularly restricted. Representative compounds are described below.

-continued

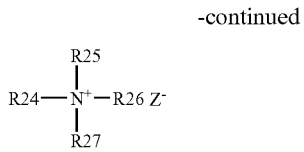
(14)

In the formula, R11 to R13, R15, R16, R18, R21 and R24 to R27 each represents a hydrogen atom or an alkyl group, and R14, R17, R19, R20, R22 and R23 each represents an alkylene group or a single bond.

In the compound represented by formula (10), R11 to R13 each represents a hydrogen atom or an alkyl group, and R14 represents an alkylene group. However, the N atom may be directly connected with the carboxyl group and in this case, R14 represents a single bond.

In the compound represented by formula (10), as the total number of carbon atoms increases, the hydrophobic portion becomes large and dissolution of the compound in an aqueous developer becomes difficult. In such a case, the dissolution is improved by mixing a dissolution auxiliary agent for assisting the dissolution, for example, an organic solvent or an alcohol. However, when the total number of carbon atoms excessively increases, the surfactant can not be dissolved in a proper mixing range. The total number of carbon atoms included in R11 to R14 is preferably from 10 to 40, more preferably from 12 to 30.

When R11 to R13 each represents an alkyl group, the alkyl group may be a straight-chain or branched structure.

The total number of carbon atoms included in R11 to R14 of the compound (surfactant) is influenced by a material, especially, a binder, used in the photosensitive layer. When a binder having high hydrophilicity is used, it tends to be preferable that the total number of carbon atoms included in R11 to R14 is relatively small. On the other hand, when a binder having low hydrophilicity is used, it is preferable that the total number of carbon atoms included in R11 to R14 is large.

Specific examples of the representative compound are set forth below.

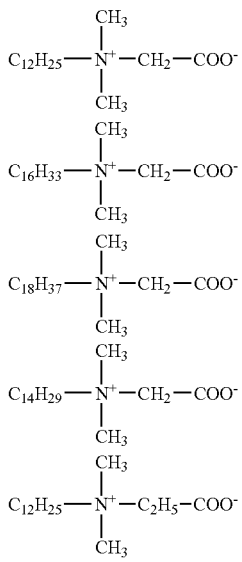

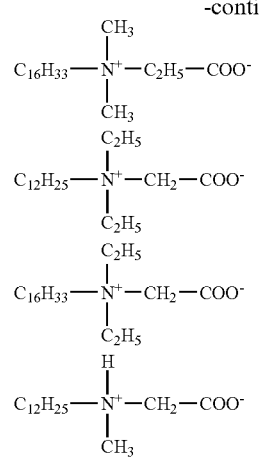

In the compound represented by formula (11), R15 to R16 each represents a hydrogen atom or an alkyl group, and R17 represents an alkylene group. However, the N atom may be directly connected with the carboxyl group and in this case, R17 represents a single bond.

Similar to the compound represented by formula (10), in the compound represented by formula (11), as the total number of carbon atoms increases, the hydrophobic portion becomes large and dissolution of the compound in an aqueous developer becomes difficult. In such a case, the dissolution is improved by mixing a dissolution auxiliary agent for assisting the dissolution, for example, an organic solvent or an alcohol. However, when the total number of carbon atoms excessively increases, the surfactant can not be dissolved in a proper mixing range. The total number of carbon atoms included in R15 to R17 is preferably from 10 to 30, more preferably from 12 to 25.

When R15 to R17 each represents an alkyl group, the alkyl group may be a straight-chain or branched structure.

The total number of carbon atoms included in R15 to R17 of the compound (surfactant) is influenced by a material, especially, a binder, used in the photosensitive layer. When a binder having high hydrophilicity is used, it tends to be preferable that the total number of carbon atoms included in R15 to R17 is relatively small. On the other hand, when a binder having low hydrophilicity is used, it is preferable that the total number of carbon atoms included in R15 to R17 is large.

In the compound described above, as $X^+$, a divalent metal ion, for example, a calcium ion or a magnesium ion, an ammonium ion or a hydrogen ion is used in addition to a monovalent metal ion, for example, a potassium ion or a sodium ion. Among them, a sodium ion or a potassium ion is preferably used.

Specific examples of the representative compound are set forth below.

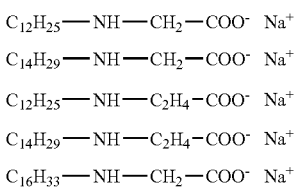

$$C_{12}H_{25}-\underset{\underset{CH_3}{|}}{N}-CH_2-COO^- \ Na^+$$

$$C_{16}H_{33}-\underset{\underset{CH_3}{|}}{N}-CH_2-COO^- \ Na^+$$

$$C_{16}H_{33}-\underset{\underset{C_2H_5}{|}}{N}-C_2H_4-COO^- \ Na^+$$

$$C_{12}H_{25}-\underset{\underset{CH_3}{|}}{N}-C_4H_8-COO^- \ K^+$$

In the compound represented by formula (12), R18 represents a hydrogen atom or an alkyl group, and R19 and R20 each represents an alkylene group. However, the N atom may be directly connected with the carboxyl groups and in this case, R19 and R20 each represents a single bond.

Similar to the compound represented by formula (10) or (11), in the compound represented by formula (12), as the total number of carbon atoms increases, the hydrophobic portion becomes large and dissolution of the compound in an aqueous developer becomes difficult. In such a case, the dissolution is improved by mixing a dissolution auxiliary agent for assisting the dissolution, for example, an organic solvent or an alcohol. However, when the total number of carbon atoms excessively increases, the surfactant can not be dissolved in a proper mixing range. The total number of carbon atoms included in R18 to R20 is preferably from 10 to 30, more preferably from 12 to 28.

When R18 represents an alkyl group, the alkyl group may be a straight-chain or branched structure.

The total number of carbon atoms included in R18 to R20 of the compound (surfactant) is influenced by a material, especially, a binder, used in the photosensitive layer. When a binder having high hydrophilicity is used, it tends to be preferable that the total number of carbon atoms included in R18 to R20 is relatively small. On the other hand, when a binder having low hydrophilicity is used, it is preferable that the total number of carbon atoms included in R18 to R20 is large.

In the compound described above, as $X^+$ or $Y^+$, a divalent metal ion, for example, a calcium ion or a magnesium ion, an ammonium ion or a hydrogen ion is used in addition to a monovalent metal ion, for example, a potassium ion or a sodium ion. Among them, a sodium ion or a potassium ion is preferably used.

Specific examples of the representative compound are set forth below.

$$C_{12}H_{25}-\underset{\underset{CH_2-COO^-Na^+}{|}}{\overset{\overset{C_2H_4-COO^-Na^+}{|}}{N}}-C_2H_4-COO^-H^+$$

$$C_{16}H_{33}-\underset{\underset{CH_2-COO^-Na^+}{|}}{N}-CH_2-COO^-Na^+$$

$$C_{12}H_{25}-\underset{\underset{C_2H_4-COO^-Na^+}{|}}{N}-C_3H_6-COO^-H^+$$

$$C_{14}H_{29}-\underset{\underset{C_3H_6-COO^-Na^+}{|}}{N}-CH_2-COO^-Na^+$$

$$C_{12}H_{25}-\underset{}{N}-C_3H_6-COO^-Na^+$$

In the compound represented by formula (13), R21 represents a hydrogen atom or an alkyl group, and R22 and R23 each represents an alkylene group. However, the N atom may be directly connected with the ethylene oxide groups and in this case, R22 and R23 each represents a single bond.

In the compound represented by formula (13) also, as the total number of carbon atoms increases, the hydrophobic portion becomes large and dissolution of the compound in an aqueous developer becomes difficult. In such a case, the dissolution is improved by mixing a dissolution auxiliary agent for assisting the dissolution, for example, an organic solvent or an alcohol. However, when the total number of carbon atoms excessively increases, the surfactant can not be dissolved in a proper mixing range. The total number of carbon atoms included in R21 to R23 is preferably from 8 to 50, more preferably from 12 to 40.

When R21 represents an alkyl group, the alkyl group may be a straight-chain or branched structure.

The total number of carbon atoms included in R21 to R23 of the compound (surfactant) is influenced by a material, especially, a binder, used in the photosensitive layer. When a binder having high hydrophilicity is used, it tends to be preferable that the total number of carbon atoms included in R21 to R23 is relatively small. On the other hand, when a binder having low hydrophilicity is used, it is preferable that the total number of carbon atoms included in R21 to R23 is large.

With respect to m and n each representing a number of the ethylene oxide, as the number increases, the hydrophilicity increases and the stability thereof in water is improved. m and n may be the same or different. m is ordinarily from 1 to 20 and n is ordinarily from 1 to 20.

Specific examples of the representative compound are set forth below.

$$C_{12}H_{25}-\underset{\underset{(CH_2CH_2O)_5H}{|}}{N}-(CH_2CH_2O)_5H$$

$$C_{12}H_{25}-\underset{\underset{(CH_2CH_2O)_7H}{|}}{N}-(CH_2CH_2O)_7H$$

$$C_{12}H_{25}-\underset{\underset{(CH_2CH_2O)_{10}H}{|}}{N}-(CH_2CH_2O)_{10}H$$

$$C_{16}H_{33}-\underset{\underset{(CH_2CH_2O)_6H}{|}}{N}-(CH_2CH_2O)_6H$$

$$C_{16}H_{33}-\underset{\underset{(CH_2CH_2O)_{10}H}{|}}{N}-(CH_2CH_2O)_{10}H$$

$$C_{16}H_{33}-\underset{\underset{(CH_2CH_2O)_{14}H}{|}}{N}-(CH_2CH_2O)_{14}H$$

$$C_{16}H_{33}-\underset{\underset{(CH_2CH_2O)_{20}H}{|}}{N}-(CH_2CH_2O)_{20}H$$

$$C_8H_{17}-\underset{\underset{(CH_2CH_2O)_5H}{|}}{N}-(CH_2CH_2O)_7H$$

$$C_8H_{17}-\underset{\underset{(CH_2CH_2O)_3H}{|}}{N}-(CH_2CH_2O)_5H$$

$$C_{20}H_{41}-\underset{\underset{(CH_2CH_2O)_8H}{|}}{N}-(CH_2CH_2O)_2H$$

$$C_{20}H_{41}-\underset{}{N}-(CH_2CH_2O)_7H$$

-continued

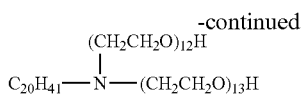

In the compound represented by formula (14), R24 to R27 each represents a hydrogen atom or an alkyl group.

In the compound represented by formula (14) also, as the total number of carbon atoms increases, the hydrophobic portion becomes large and dissolution of the compound in an aqueous developer becomes difficult. In such a case, the dissolution is improved by mixing a dissolution auxiliary agent for assisting the dissolution, for example, an organic solvent or an alcohol. However, when the total number of carbon atoms excessively increases, the surfactant can not be dissolved in a proper mixing range. The total number of carbon atoms included in R24 to R27 is preferably from 10 to 30, more preferably from 12 to 28.

When R24 to R27 each represents an alkyl group, the alkyl group may be a straight-chain or branched structure.

The total number of carbon atoms included in R24 to R27 of the compound (surfactant) is influenced by a material, especially, a binder, used in the photosensitive layer. When a binder having high hydrophilicity is used, it tends to be preferable that the total number of carbon atoms included in R24 to R27 is relatively small. On the other hand, when a binder having low hydrophilicity is used, it is preferable that the total number of carbon atoms included in R24 to R27 is large.

$Z^-$ represents a counter anion. The counter anion is not restricted but, for example, $Cl^-$, $Br^-$ or $I^-$ is used in many cases.

Specific examples of the representative compound are set forth below.

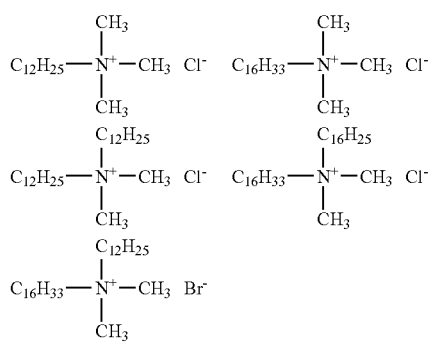

The water-soluble polymer compound for use in the developer according to the invention includes, for example, soybean polysaccharide, modified starch, gum arabic, dextrin, a cellulose derivative (for example, carboxymethyl cellulose, carboxyethyl cellulose or methyl cellulose) or a modified product thereof, pullulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those known can be used. For example, as a commercial product, Soyafive (trade name, produced by Fuji Oil Co., Ltd.) is available and various grade products can be used. The soybean polysaccharide preferably used has viscosity in a range from 10 to 100 mPa/sec in a 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound is preferably from 0.1 to 20% by weight, and more preferably from 0.5 to 10% by weight, in the developer.

The developer for use in the invention may contain an organic solvent. The organic solvent that can be contained in the developer include, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or nomochlorobenzene) and a polar solvent.

Examples of the polar solvent include an alcohol (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

Further, when the organic solvent is insoluble in water, it may be employed by being solubilized in water using a surfactant or the like. In the case where the developer contains the organic solvent, the concentration of the organic solvent is desirably less than 40% by weight in view of safety and inflammability.

Into the developer for use in the invention, an antiseptic agent, a chelating agent, a defoaming agent, an organic acid, an inorganic acid, an inorganic salt or the like can be incorporated in addition to the above components.

As the antiseptic agent, for example, phenol or a derivative thereof, formalin, an imidazole derivative, sodium dehydroacetate, a 4-isothiazolin-3-one derivative, benzisotiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1-dibromo-1-nitro-2-ethanol or 1,1-dibromo-1-nitro-2-propanol are preferably used.

As the chelating agent, for example, ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylethylenediaminetriacetic acid, potassium salt thereof, sodium salt thereof; nitrilotriacetic acid, sodium salt thereof; organic phosphonic acids, for example, 1-hydroxyethane-1,1-diphosphonic acid, potassium salt thereof, sodium salt thereof; aminotri(methylenephosphonic acid), potassium salt thereof, sodium salt thereof; and phophonoalkanetricarboxylic acids are illustrated. A salt of an organic amine is also effectively used in place of the sodium salt or potassium salt in the chelating agents.

As the defoaming agent, for example, a conventional silicone-based self-emulsifying type or emulsifying type defoaming agent, and a nonionic surfactant having HLB of 5 or less are used. The silicone defoaming agent is preferably used. Any of emulsifying dispersing type and solubilizing type can be used.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid are illustrated. The organic acid can also be used in the form of an alkali metal salt or an ammonium salt.

As the inorganic acid and inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate are illustrated.

The developer described above can be used as a developer and a development replenisher for an exposed negative-working lithographic printing plate precursor, and it is preferably applied to an automatic processor described hereinafter. In the case of conducting the development processing using an automatic processor, the developer becomes fatigued in accordance with the processing amount, and hence the processing ability may be restored using a replenisher or a fresh developer. Such a replenishment system can be preferably applied to the plate-making method of the lithographic printing plate precursor according to the invention.

The development processing using the aqueous solution having pH of 2 to 10 according to the invention is preferably performed by an automatic processor equipped with a supplying means for a developer and a rubbing member. As the automatic processor, there are illustrated an automatic processor in which a lithographic printing plate precursor after image-recording is subjected to a rubbing treatment while it is transporting described in JP-A-2-220061 and JP-A-60-59351, and an automatic processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic processor using a rotating brush roll as the rubbing member is particularly preferred.

The rotating brush roller which can be preferably used in the invention can be appropriately selected by taking account, for example, of scratch resistance of the image area and nerve strength of the support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-U-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl(meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used.

The outer diameter of the rotating brush roller is preferably from 30 to 200 mm, and the peripheral velocity at the tip of the brush rubbing the plate surface is preferably from 0.1 to 5 m/sec.

Further, it is preferred to use a plurality, that is, two or more of the rotating brush rollers.

The rotary direction of the rotating brush roller for use in the invention may be the same direction or the opposite direction with respect to the transporting direction of the lithographic printing plate precursor of the invention, but when two or more rotating brush rollers are used in an automatic processor as shown in FIG. 1, it is preferred that at least one rotating brush roller rotates in the same direction and at least one rotating brush roller rotates in the opposite direction with respect to the transporting direction. By such arrangement, the photosensitive layer in the non-image area can be more steadily removed. Further, a technique of rocking the rotating brush roller in the rotation axis direction of the brush roller is also effective.

The developer can be used at an appropriate temperature, and the developer temperature is preferably from 10 to 50° C.

In the invention, the lithographic printing plate after the rubbing treatment may be subsequently subjected to water washing, a drying treatment and an oil-desensitization treatment, if desired. In the oil-desensitization treatment, a known oil-desensitizing solution can be used.

Further, in a plate-making process of the lithographic printing plate precursor to prepare a lithographic printing plate according to the invention, the entire surface of the lithographic printing plate precursor may be heated, if desired, before or during the exposure or between the exposure and the development. By the heating, the image-forming reaction in the photosensitive layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise in that undesirable fog occurs in the non-image area. On the other hand, the heating after the development can be performed using a very strong condition. Ordinarily, the heat treatment is carried out in a temperature range of 200 to 500° C. When the temperature is too low, a sufficient effect of strengthening the image may not be obtained, whereas when it is excessively high, problems of deterioration of the support and thermal decomposition of the image area may occur.

The plate-making process is described in more detail below.

In the invention, although the development processing can be carried out just after the exposure step, the heat treatment step may intervene between the exposure step and the development step as described above. The heat treatment is effective for increasing the printing durability and improving uniformity of the image hardness degree in the entire surface of printing plate precursor. The conditions of the heat treatment can be appropriately determined in a range for providing such effects. Examples of the heating means include a conventional convection oven, an IR irradiation apparatus, an IR laser, a microwave apparatus or a Wisconsin oven. For instance, the heat treatment can be conducted by maintaining the printing plate precursor at a plate surface temperature ranging from 70 to 150° C. for a period of one second to 5 minutes, preferably at 80 to 140° C. for 5 seconds to one minute, more preferably at 90 to 130° C. for 10 to 30 seconds. In the above-described range, the effects described above are efficiently achieved and an adverse affect, for example, change in shape of the printing plate precursor due to the heat can be preferably avoided.

According to the invention, the development processing step is conducted after the exposure step, preferably after the exposure step and the heat treatment step to prepare a lithographic printing plate. It is preferable that a plate setter used in the exposure step, a heat treatment means used in the heat treatment step and a development apparatus used in the development processing step are connected with each other and the lithographic printing plate precursor is subjected to automatically continuous processing. Specifically, a plate-making line wherein the plate setter and the development apparatus are connected with each other by transport means, for example, a conveyer is illustrated. Also, the heat treatment means may be placed between the plate setter and the development apparatus or the heat treatment means and the development apparatus may constitute a unit apparatus.

In case where the lithographic printing plate precursor used is apt to be influenced by surrounding light under a working environment, it is preferable that the plate-making line is blinded by a filter, a cover or the like.

After the image formation as described above, the entire surface of lithographic printing plate may be exposed to active ray, for example, ultraviolet light to accelerate hardening of the image area. As a light source for the entire surface exposure, for example, a carbon arc lamp, a mercury lamp, a gallium lamp, a metal halide lamp, a xenon lamp, a tungsten lamp or various laser beams are exemplified. In order to obtain sufficient printing durability, the amount of the entire surface exposure is preferably 10 mJ/cm$^2$ or more, more preferably 100 mJ/cm$^2$ or more.

Heating may be performed at the same time with the entire surface exposure. By performing the heating, further improvement in the printing durability is recognized. Examples of the heating means include a conventional convection oven, an IR irradiation apparatus, an IR laser, a microwave apparatus or a Wisconsin oven. The plate surface temperature at the heating is preferably from 30 to 150° C., more preferably from 35 to 130° C., and still more preferably from 40 to 120° C.

In advance of the above-described development processing, the lithographic printing plate precursor is imagewise exposed through a transparent original having a line image, a halftone dot image or the like, or imagewise exposed, for example, by scanning of laser beam based on digital data.

The desirable wavelength of the light source is from 350 to 450 nm, and specifically, an InGaN semiconductor laser is preferably used. The exposure mechanism may be any of an internal drum system, an external drum system and a flat bed system.

Other examples of the exposure light source which can be used in the invention include an ultra-high pressure mercury lamp, a high pressure mercury lamp, a medium pressure mercury lamp, a low pressure mercury lamp, a chemical lamp, a carbon arc lamp, a xenon lamp, a metal halide lamp, various visible or ultraviolet laser lamps, a fluorescent lamp, a tungsten lamp and sunlight.

As for the available laser light source of 350 to 450 nm, the followings can be used.

A gas laser, for example, Ar ion laser (364 nm, 351 nm, 10 mW to 1 W), Kr ion laser (356 nm, 351 nm, 10 mW to 1 W) and He—Cd laser (441 nm, 325 nm, 1 mW to 100 mW); a solid laser, for example, a combination of Nd:YAG (YVO$_4$) with SHG crystals×twice (355 nm, 5 mW to 1 W) and a combination of Cr:LiSAF with SHG crystal (430 nm, 10 mW); a semiconductor laser system, for example, a KNbO$_3$ ring resonator (430 nm, 30 mW), a combination of a waveguide-type wavelength conversion element with an AlGaAs or InGaAs semiconductor (380 nm to 450 nm, 5 mW to 100 mW), a combination of a waveguide-type wavelength conversion element with an AlGaInP or AlGaAs semiconductor (300 nm to 350 nm, 5 mW to 100 mW), and AlGaInN (350 nm to 450 nm, 5 mW to 30 mW); a pulse laser, for example, N$_2$ laser (337 nm, pulse 0.1 to 10 mJ) and XeF (351 nm, pulse 10 to 250 mJ) can be used. Among the light sources, the AlGaInN semiconductor laser (commercially available InGaN semiconductor laser, 400 to 410 nm, 5 to 30 mW) is particularly preferable in view of the wavelength characteristics and cost.

As for the exposure apparatus for the lithographic printing plate precursor of scanning exposure system, the exposure mechanism includes an internal drum system, an external drum system and a flat bed system. As the light source, among the light sources described above, those capable of conducting continuous oscillation can be preferably utilized. In practice, the exposure apparatuses described below are particularly preferable in view of the relationship between the sensitivity of photosensitive material and the time for plate-making.

A single beam to triple beam exposure apparatus of internal drum system, using one or more gas or solid laser light sources so as to provide a semiconductor laser having a total output of 20 mW or more A multi-beam (from 1 to 10 beams) exposure apparatus of flat bed system, using one or more semiconductor, gas or solid lasers so as to provide a total output of 20 mW or more A multi-beam (from 1 to 9 beams) exposure apparatus of external drum system, using one or more semiconductor, gas or solid lasers so as to provide a total output of 20 mW or more A multi-beam (10 or more beams) exposure apparatus of external drum system, using one or more semiconductor or solid lasers so as to provide a total output of 20 mW or more In the laser direct drawing-type lithographic printing plate precursor, the following equation (eq 1) is ordinarily established among the sensitivity X (J/cm$^2$) of photosensitive material, the exposure area S (cm$^2$) of photosensitive material, the power q (W) of one laser light source, the number n of lasers and the total exposure time t (s):

$$X \cdot S = n \cdot q \cdot t \tag{eq 1}$$

i) In the case of the internal drum (single beam) system

The following equation (eq 2) is ordinarily established among the laser revolution number f (radian/s), the sub-scanning length Lx (cm) of photosensitive material, the resolution Z (dot/cm) and the total exposure time t (s):

$$f \cdot Z \cdot t = Lx \tag{eq 2}$$

ii) In the case of the external drum (multi-beam) system

The following equation (eq 3) is ordinarily established among the drum revolution number F (radian/s), the sub-scanning length Lx (cm) of photosensitive material, the resolution Z (dot/cm), the total exposure time t (s) and the number (n) of beams:

$$F \cdot Z \cdot n \cdot t = Lx \quad (eq\ 3)$$

iii) In the case of the flat bed (multi-beam) system

The following equation (eq 4) is ordinarily established among the revolution number H (radian/s) of polygon mirror, the sub-scanning length Lx (cm) of photosensitive material, the resolution Z (dot/cm), the total exposure time t (s) and the number (n) of beams:

$$H \cdot Z \cdot n \cdot t = Lx \quad (eq\ 4)$$

When the resolution (2,560 dpi) required for a practical printing plate, the plate size (A1/B1, sub-scanning length: 42 inch), the exposure condition of about 20 sheets/hour and the photosensitive characteristics (photosensitive wavelength, sensitivity: about 0.1 mJ/cm$^2$) of the lithographic printing plate precursor according to the invention are substituted for the above equations, it can be understood that the lithographic printing plate precursor according to the invention is preferably combined with a multi-beam exposure system using a laser having a total output of 20 mW or more, and on taking account of operability, cost and the like, most preferably combined with an external drum system semiconductor laser multi-beam (10 or more beams) exposure apparatus.

EXAMPLES

The present invention will be described in more detail with reference to the following examples, but the invention should not be construed as being limited thereto.

(Preparation of Support 1)

An aluminum plate (material: JIS A1050) having a thickness of 0.3 mm was dipped in an aqueous 10% by weight sodium hydroxide solution at 60° C. for 25 seconds to effect etching, washed with running water, neutralized and cleaned with an aqueous 20% by weight nitric acid solution and then washed with water. The aluminum plate was subjected to an electrolytic surface roughening treatment in an aqueous 1% by weight nitric acid solution using an alternating current with a sinusoidal waveform at an anode time electricity of 300 coulomb/dm$^2$. Subsequently, the aluminum plate was dipped in an aqueous 1% by weight sodium hydroxide solution at 40° C. for 5 seconds, dipped in an aqueous 30% by weight sulfuric acid solution at 60° C. for 40 seconds to effect a desmut treatment, and then subjected to an anodizing treatment in an aqueous 20% by weight sulfuric acid solution for 2 minutes at a current density of 2 A/dm$^2$ to form an anodic oxide film having a thickness of 2.7 g/m$^2$. Thereafter, the aluminum plate was treated with an aqueous 1% by weight sodium silicate solution at 20° C. for 10 seconds.

The center line average roughness (Ra) of the thus-treated aluminum plate was measured using a stylus having a diameter of 2 μm and found to be 0.25 μm (Ra indication according to JIS B0601).

Further, Undercoat Solution (1) shown below was coated to have a dry coating amount of 10 mg/m$^2$ and dried in an oven at 80° C. for 10 seconds to prepare a support having an undercoat layer to be used in the experiments described below.

<Undercoat Solution (1)>

| | |
|---|---|
| Undercoat Compound (1) shown below | 0.017 g |
| Methanol | 9.00 g |
| Water | 1.00 g |
| Undercoat Compound (1): | |

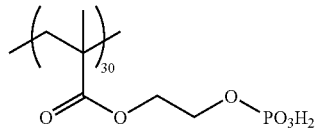

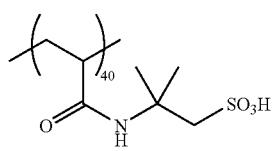

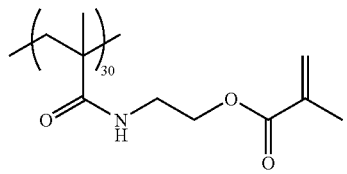

[Preparation of Lithographic Printing Plate Precursor (1)]

On the support having an undercoat layer prepared above, Coating Solution (1) for Photosensitive Layer having the composition shown below was coated using a bar and dried in an oven at 70° C. for 60 seconds to form a photosensitive layer having a dry coating amount of 1.1 g/m$^2$. On the photosensitive layer, Coating Solution (1) for Protective Layer having the composition shown below was coated using a bar to have a dry coating amount of 0.75 g/m$^2$ and dried at 125° C. for 70 seconds to prepare Lithographic Printing Plate Precursor (1).

<Coating Solution (1) for Photosensitive Layer>

| | |
|---|---|
| Binder Polymer (1) shown below (acid value: 0 meq/g; weight average molecular weight: 80,000) | 0.54 g |
| Polymerizable compound: Dipentaerythritol pentaacrylate (SR399E, produced by Nippon Kayaku Co., Ltd.) | 0.48 g |
| Sensitizing Dye (1) shown below (absorption maximum wavelength: 364 nm) | 0.06 g |
| Polymerization Initiator (1) shown below | 0.18 g |
| Co-sensitizer (1) shown below | 0.02 g |
| Dispersion of ε-phthalocyanine pigment: (pigment: 15 parts by weight; dispersing agent (Binder Polymer (1)): 10 parts by weight; solvent (cyclohexanone/methoxypropyl acetate/1-methoxy-2-propanol = 15 parts by weight/20 parts by weight/40 parts by weight)) | 0.40 g |
| Thermal polymerization inhibitor: N-nitrosophenylhydroxylamine aluminum salt | 0.01 g |
| Fluorine-Based Surfactant (1) shown below | 0.001 g |
| Polyoxyethylene-polyoxypropylene condensate (Pluronic L44, produced by ADEKA Corp.) | 0.04 g |
| Tetraethylamine hydrochloride | 0.01 g |

-continued

| | |
|---|---|
| 1-Methoxy-2-propanol | 3.5 g |
| Methyl ethyl ketone | 8.0 g |

Binder Polymer (1):

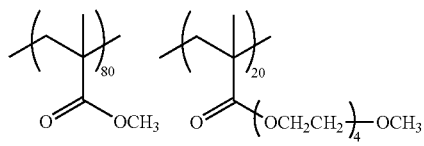

Sensitizing Dye (1):

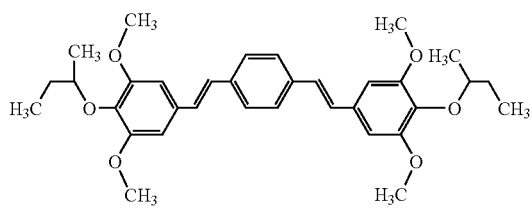

Polymerization Initiator (1):

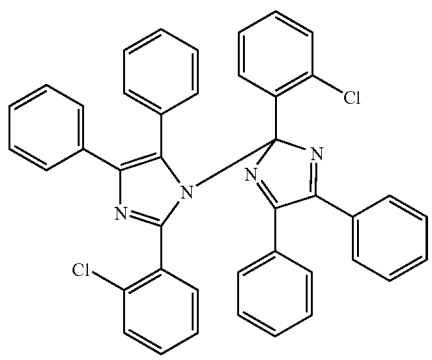

Co-sensitizer (1):

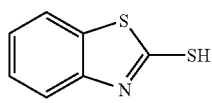

Fluorine-Based Surfactant (1):

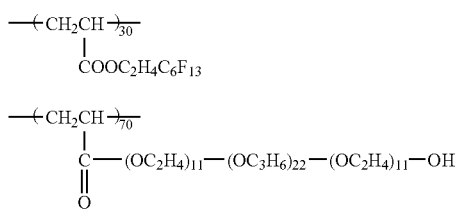

<Coating Solution (1) for Protective Layer>

| | |
|---|---|
| Polyvinyl alcohol (saponification degree: 98% by mole; polymerization degree: 500) | 40 g |
| Polyvinyl pyrrolidone (molecular weight: 50,000) | 5 g |
| Vinyl pyrrolidone/vinyl acetate (1/1) copolymer (molecular weight: 70,000) | 0.5 g |
| Surfactant (polyoxyethylene lauryl ether: Emalex 710, produced by Nihon-Emulsion Co., Ltd.) | 0.5 g |
| Water | 950 g |

[Preparation of Lithographic Printing Plate Precursor (2)]

Lithographic Printing Plate Precursor (2) was prepared in the same manner as in the preparation of Lithographic Printing Plate Precursor (1) except for changing Binder Polymer (1) in Coating Solution (1) for Photosensitive Layer to Binder Polymer (5) (acid value: 1.9 meq/g; weight average molecular weight: 80,000) shown below.

Binder Polymer (5):

[Preparation of Lithographic Printing Plate Precursor (3)]

Lithographic Printing Plate Precursor (3) was prepared in the same manner as in the preparation of Lithographic Printing Plate Precursor (1) except for changing Coating Solution (1) for Photosensitive Layer to Coating Solution (2) for Photosensitive Layer having the composition shown below.

<Coating Solution (2) for Photosensitive Layer>

| | |
|---|---|
| Polymerization Initiator (1) shown above | 0.2 g |
| Sensitizing Dye (1) shown above | 0.1 g |
| Binder Polymer (1) shown above (average molecular weight: 80,000) | 3.0 g |
| Polymerizable compound: Isocyanuric acid EO-modified diacrylate (Aronics M-215, produced by Toa Gosei Co., Ltd.) | 6.2 g |
| Leuco Crystal Violet | 0.2 g |
| Fluorine-based Surfactant (1) shown above | 0.1 g |
| Dispersion of Microcapsule (1) shown below | 25.0 g |
| Methyl ethyl ketone | 35.0 g |
| 1-Methoxy-2-propanol | 35.0 g |

(Preparation of Dispersion of Microcapsule (1))

As an oil phase component, 10 g of adduct of trimethylolpropane and xylene diisocyanate (Takenate D-110N, produced by Mitsui Takeda Chemicals, Inc.), 4.15 g of dipentaerythritol pentaacrylate (SR399E, produced by Nippon Kayaku Co., Ltd.) and 0.1 g of Pionin A-41C (produced by Takemoto Oil & Fat Co., Ltd.) were dissolved in 17 g of ethyl acetate. As an aqueous phase component, 40 g of an aqueous 4% by weight PVA-205 solution was prepared. The oil phase component and the aqueous phase component were mixed and emulsified using a homogenizer at 12,000 rpm for 10 minutes. The resulting emulsion was added to 25 g of distilled water and the mixture was stirred at room temperature for 30 minutes and then stirred at 40° C. for 3 hours. The thus-obtained microcapsule solution was diluted with distilled water to have a solid content concentration of 20% by weight to prepare Dispersion of Microcapsule (1). The average particle diameter of the microcapsule was 0.25 µm.

[Preparation of Lithographic Printing Plate Precursor (4)]

Lithographic Printing Plate Precursor (4) was prepared in the same manner as in the preparation of Lithographic Printing Plate Precursor (1) except for changing Binder Polymer (1) in Coating Solution (1) for Photosensitive Layer to Binder Polymer (2) (acid value; 0 meq/g; weight average molecular weight: 70,000) shown below.

[Preparation of Lithographic Printing Plate Precursor (5)]

Lithographic Printing Plate Precursor (5) was prepared in the same manner as in the preparation of Lithographic Printing Plate Precursor (1) except for changing Binder Polymer (1) in Coating Solution (1) for Photosensitive Layer to Binder Polymer (3) (acid value; 0 meq/g; weight average molecular weight: 100,000) shown below.

[Preparation of Lithographic Printing Plate Precursor (6)]

Lithographic Printing Plate Precursor (6) was prepared in the same manner as in the preparation of Lithographic Printing Plate Precursor (1) except for changing Binder Polymer (1) in Coating Solution (1) for Photosensitive Layer to Binder Polymer (4) (acid value; 0 meq/g; weight average molecular weight: 90,000) shown below.

Binder Polymer (2):

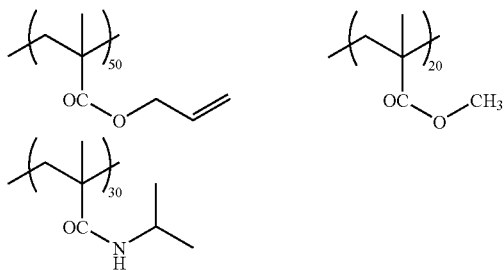

Binder Polymer (3):

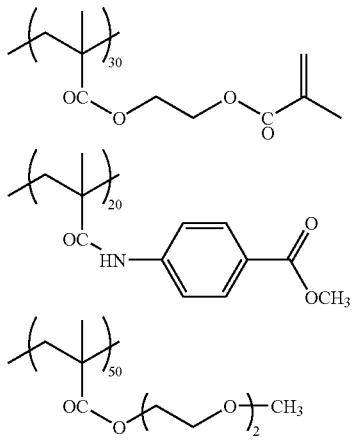

Binder Polymer (4):

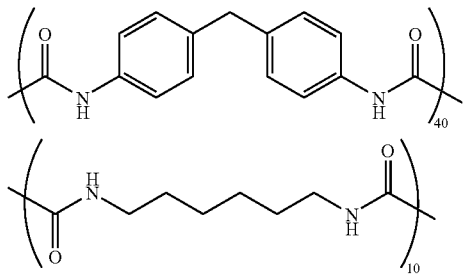

-continued

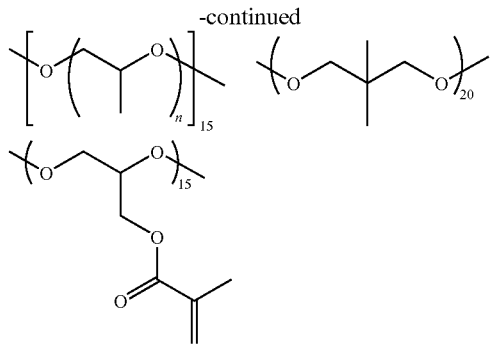

[Preparation of Lithographic Printing Plate Precursor (7)]

Lithographic Printing Plate Precursor (7) was prepared in the same manner as in the preparation of Lithographic Printing Plate Precursor (1) except for changing Co-sensitizer (1) in Coating Solution (1) for Photosensitive Layer to Co-sensitizer (2) shown below.

Co-Sensitizer (2):

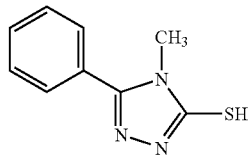

[Preparation of Lithographic Printing Plate Precursor (8)]

Lithographic Printing Plate Precursor (8) was prepared in the same manner as in the preparation of Lithographic Printing Plate Precursor (1) except for changing Co-sensitizer (1) in Coating Solution (1) for Photosensitive Layer to Co-sensitizer (3) shown below.

Co-Sensitizer (3):

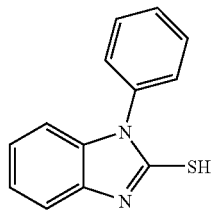

[Preparation of Lithographic Printing Plate Precursor (9)]

Lithographic Printing Plate Precursor (9) was prepared in the same manner as in the preparation of Lithographic Printing Plate Precursor (1) except for changing Coating Solution (1) for Protective Layer to Coating Solution (2) for Protective Layer having the composition shown below and coating using a bar to have a dry coating amount of 0.2 g/M$^2$.

<Coating Solution (2) for Protective Layer>

| | |
|---|---|
| Dispersion of Mica (1) shown below | 13.0 g |
| Polyvinyl alcohol (saponification degree: 98% by mole; polymerization degree: 500) | 1.3 g |
| Sodium 2-ethylhexylsulfosuccinate | 0.2 g |
| Vinyl pyrrolidone/vinyl acetate (1/1) copolymer (molecular weight: 70,000) | 0.05 g |
| Surfactant (Emalex 710, produced by Nihon-Emulsion Co., Ltd.) | 0.05 g |
| Water | 133 g |

(Preparation of Dispersion of Mica (1))

In 368 g of water was added 32 g of synthetic mica (SOMASIF ME-100, produced by CO-OP Chemical Co., Ltd.; aspect ratio: 1,000 or more) and dispersed using a homogenizer until the average particle diameter (measured by a laser scattering method) became 0.5 μm to obtain Dispersion of Mica (1).

[Preparation of Lithographic Printing Plate Precursor (10)]

Lithographic Printing Plate Precursor (10) was prepared in the same manner as in the preparation of Lithographic Printing Plate Precursor (1) except for changing Support 1 to Support 2 shown below.

(Preparation of Support 2)

An aluminum plate (material: JIS A1050) having a thickness of 0.3 mm was subjected to a degrease treatment with an aqueous 10% by weight sodium aluminate solution at 50° C. for 30 seconds in order to remove rolling oil on the surface thereof. Thereafter, the aluminum plate surface was grained using three nylon brushes implanted with bundled bristles having a diameter of 0.3 mm and an aqueous suspension (specific gravity: 1.1 g/cm$^3$) of pumice having a median diameter of 25 μm, and then thoroughly washed with water. The plate was etched by dipping it in an aqueous 25% by weight sodium hydroxide solution at 45° C. for 9 seconds and after washing with water, dipped in an aqueous 20% by weight nitric acid solution at 60° C. for 20 seconds, followed by washing with water. The etching amount of the grained surface was about 3 g/m$^2$.

Subsequently, the aluminum plate was subjected to a continuous electrochemical surface roughening treatment using alternate current voltage of 60 Hz. The electrolytic solution used was an aqueous 1% by weight nitric acid solution (containing 0.5% by weight of aluminum ion) at a liquid temperature of 50° C. The electrochemical surface roughening treatment was performed using a rectangular wave alternate current having a trapezoidal waveform such that the time TP necessary for the current value to reach the peak from zero was 0.8 msec and the duty ratio was 1:1, and disposing a carbon electrode as the counter electrode. The auxiliary anode used was ferrite. The current density was 30 A/dm$^2$ in terms of the peak value of current, and 5% of the current flowing from the power source was divided to the auxiliary anode. The quantity of electricity at the nitric acid electrolysis was 175 C/dm$^2$ when the aluminum plate was serving as the anode. Then, the aluminum plate was washed with water by spraying.

Then, the aluminum plate was subjected to an electrochemical surface roughening treatment in the same manner as in the nitric acid electrolysis above using, as the electrolytic solution, an aqueous 0.5% by weight hydrochloric acid solution (containing 0.5% by weight of aluminum ion) at a liquid temperature of 50° C. under the conditions that the quantity of electricity was 50 C/dm$^2$ when the aluminum plate was serving as the anode, and then washed with water by spraying. The plate was then treated in an aqueous 15% by weight sulfuric acid solution (containing 0.5% by weight of aluminum ion) as the electrolytic solution at a current density of 15 A/dm$^2$ to provide a direct current anodic oxide film of 2.5 g/m$^2$, thereafter washed with water and dried. Then, the aluminum plate was treated with an aqueous 1% by weight sodium silicate solution at 20° C. for 10 seconds.

The center line average roughness Ra of the thus-treated aluminum plate was measured using a stylus having a diameter of 2 μm and found to be 0.51 μm (Ra indication according to JIS B0601).

On the aluminum plate thus-treated was coated Undercoat Solution (2) having the composition shown below using a bar to have a dry coating amount of 10 mg/m$^2$, followed by drying in an oven at 80° C. for 20 seconds, thereby preparing Support 2.

<Undercoat Solution (2)>

| | |
|---|---|
| Sol solution shown below | 100 g |
| Methanol | 900 g |
| Sol Solution | |
| Phosmer PE (produced by Uni-Chemical Co., Ltd) | 5 g |
| Methanol | 45 g |
| Water | 10 g |
| Phosphoric acid (85% by weight) | 5 g |
| Tetraethoxysilane | 20 g |
| 3-Methacryloxypropyltrimethoxysilane | 15 g |

[Preparation of Lithographic Printing Plate Precursor (11)]

Lithographic Printing Plate Precursor (11) was prepared in the same manner as in the preparation of Lithographic Printing Plate Precursor (1) except for changing Sensitizing Dye (1) in Coating Solution (1) for Photosensitive Layer to Sensitizing Dye (2) shown below.

Sensitizing Dye (2):

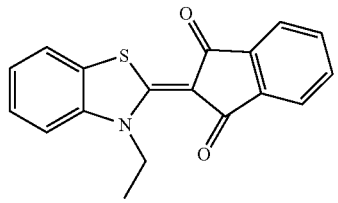

[Preparation of Lithographic Printing Plate Precursor (12)]

Lithographic Printing Plate Precursor (12) was prepared in the same manner as in the preparation of Lithographic Printing Plate Precursor (1) except for changing Sensitizing Dye (1) in Coating Solution (1) for Photosensitive Layer to Sensitizing Dye (3) shown below. The absorption maximum wavelength of Sensitizing Dye (3) is 387 nm.

Sensitizing Dye (3):

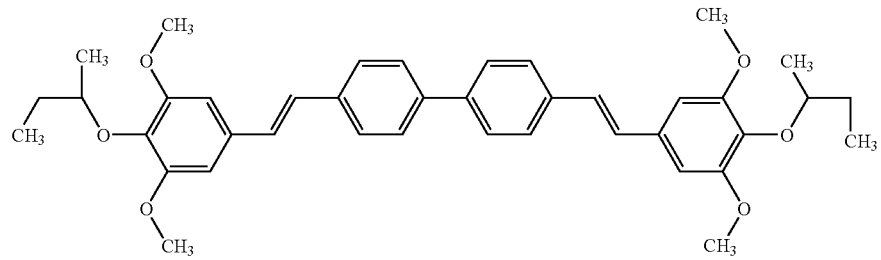

Examples 1 to 9 and 13 and Comparative Examples 1 to 2

(1) Exposure, Development and Printing

Each of Lithographic Printing Plate Precursors (1) to (12) was subjected to imagewise exposure using a semiconductor laser of 405 nm having an output of 100 mW while changing energy density.

Then, development processing was performed in an automatic development processor having a structure shown in FIG. 1 using Developer (1) having the composition shown below. The pH of the developer was 5. The automatic development processor was an automatic processor having two rotating brush rollers. As for the rotating brush rollers used, the first brush roller was a brush roller having an outer diameter of 50 mm and being implanted with fiber of polybutylene terephthalate (bristle diameter: 200 μm, bristle length: 17 mm), and the brush roller was rotated at 200 rpm in the same direction as the transporting direction (peripheral velocity at the tip of brush: 0.52 m/sec). The second brush roller was a brush roller having an outer diameter of 50 mm and being implanted with fiber of polybutylene terephthalate (bristle diameter: 200 μm, bristle length: 17 mm), and the brush roller was rotated at 200 rpm in the opposite direction to the transporting direction (peripheral velocity at the tip of brush: 0.52 m/sec). The transportation of the lithographic printing plate precursor was performed at a transporting speed of 100 cm/min.

The developer was supplied on the surface of the lithographic printing plate precursor by showering from a spray pipe using a circulation pump. The tank volume for the developer was 10 liters.

Developer (1)

| | |
|---|---|
| Water | 100 g |
| Benzyl alcohol | 1 g |
| Polyoxyethylene naphthyl ether (average number of oxyethylene: n = 13) (Newcol B13, produced by Nippon Nyukazai Co., Ltd.) | 1 g |
| Sodium salt of dioctylsulfosuccinic acid ester | 0.5 g |
| Gum arabic | 1 g |
| Ethylene glycol | 0.5 g |
| Ammonium primary phosphate | 0.05 g |
| Citric acid | 0.05 g |
| Tetrasodium salt of ethylenediaminetetraacetate | 0.05 g |

The lithographic printing plate after development was mounted on a printing machine, SOR-M, produced by Heidelberg, and printing was performed at a printing speed of 6,000 sheets per hour using dampening water (EU-3 (etching solution, produced by Fuji Photo Film Co., Ltd.))/water/isopropyl alcohol=1/89/10 (by volume ratio)) and TRANS-G (N) black ink (produced by Dai-Nippon Ink & Chemicals, Inc.).

(2) Evaluation

Using the lithographic printing plate precursors prepared above, the sensitivity, developing property and safelight aptitude were evaluated in the following manner.

<Sensitivity>

After performing printing of 100 sheets as described above and confirming that a printed material free from ink stain in the non-image area was obtained, 500 sheets were continuously printed. Thus, 600 sheets in total were printed. The exposure amount for causing no unevenness in the ink density of the image area on the 600th printed material was determined and defined as the sensitivity.

<Developing Property>

The lithographic printing plate precursor prepared was subjected to the image exposure and development processing in the same manner as described above. After the development processing, the non-image area of the lithographic printing plate was visually observed and the presence or absence of the residue of the photosensitive layer was evaluated.

<Safelight Aptitude>

The lithographic printing plate precursor prepared was exposed under a yellow lamp (a fluorescent lamp cutting wavelength of 500 nm or shorter; illuminance: 250 lux) for 10 minutes, 20 minutes or 30 minutes before image exposure and subsequently subjected to the image exposure and development processing in the same manner as described above. After the development processing, the non-image area of the lithographic printing plate was visually observed and the presence or absence of the formation of fog (residue of the photosensitive layer) was evaluated.

The results obtained are shown in Table 1.

TABLE 1

| | Lithographic Printing Plate Precursor | Developing Property | Sensitivity (mJ/cm$^2$) | Safelight Aptitude | | |
|---|---|---|---|---|---|---|
| | | | | 10 Minutes | 20 Minutes | 30 Minutes |
| Example 1 | 1 | ○ | 0.20 | ○ | ○ | ○ |
| Comparative Example 1 | 2 | X | Unable to evaluate | Unable to evaluate | Unable to evaluate | Unable to evaluate |
| Example 2 | 3 | ○ | 0.25 | ○ | ○ | ○ |
| Example 3 | 4 | ○ | 0.20 | ○ | ○ | ○ |
| Example 4 | 5 | ○ | 0.20 | ○ | ○ | ○ |
| Example 5 | 6 | ○ | 0.15 | ○ | ○ | ○ |
| Example 6 | 7 | ○ | 0.15 | ○ | ○ | ○ |
| Example 7 | 8 | ○ | 0.10 | ○ | ○ | ○ |
| Example 8 | 9 | ○ | 0.20 | ○ | ○ | ○ |
| Example 9 | 10 | ○ | 0.25 | ○ | ○ | ○ |
| Comparative Example 2 | 11 | ○ | 0.5 | ○ | ○ | ○ |
| Example 10 | 1 | ○ | 0.20 | ○ | ○ | X |
| Example 11 | 1 | ○ | 0.20 | ○ | ○ | ○ |

TABLE 1-continued

| | Lithographic Printing Plate Precursor | Developing Property | Sensitivity (mJ/cm²) | Safelight Aptitude | | |
|---|---|---|---|---|---|---|
| | | | | 10 Minutes | 20 Minutes | 30 Minutes |
| Example 12 | 1 | ○ | 0.20 | ○ | ○ | ○ |
| Example 13 | 12 | ○ | 0.20 | ○ | ○ | ○ |

○: No occurrence of fog
X: Occurrence of fog

Example 10

The image exposure, development processing and printing were conducted in the same manner as in Example 1 except that the development processing was carried out by the automatic development processor in which the two rotating brush rollers were detached. As a result, the safelight aptitude was somewhat deteriorated as shown in Table 1.

Example 11

The image exposure, development processing and printing were conducted in the same manner as in Example 1 except for changing the polyoxyethylene naphthyl ether used in Developer (1) to an anionic surfactant having the structure shown below (polyoxyethylene naphthyl ether sulfuric ester salt, Newcol B4SN, produced by Nippon Nyukazai Co., Ltd.) and further adding 0.1 g of a defoaming agent, FS Antifoam DR110N (produced by Dow Corning Corp., silicone-based emulsion). As a result, the evaluation results similar to those in Example 1 were obtained. The pH of the developer was 5.

Anionic Surfactant:

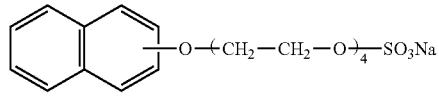

Example 12

The image exposure, development processing and printing were conducted in the same manner as in Example 1 except for changing Developer (1) to Developer (2) having the composition shown below. As a result, the evaluation results similar to those in Example 1 were obtained. The pH of the developer was 4.5.

Developer (2)

| | |
|---|---|
| Water | 100 g |
| Sodium alkylnaphthalenesulfonate (Pelex NB-L, produced by Kao Corp.) | 5 g |
| Gum arabic | 1 g |
| Ammonium primary phosphate | 0.05 g |
| Citric acid | 0.05 g |
| Tetrasodium salt of ethylenediaminetetraacetate | 0.05 g |

Example 14

The image exposure, development processing and printing were conducted in the same manner as in Example 12 except that within 30 seconds after the image exposure, the exposed lithographic printing plate precursor was put in an oven and heated the whole surface of the lithographic printing plate precursor by blowing hot air to maintain at 110° C. for 15 seconds and after that the development processing was performed within 30 seconds in the same manner as in Example 12.

The sensitivity was changed to 0.09 mJ/cm² by conducting the heat treatment and the developing property and safelight aptitude were good without the residue of the photosensitive layer in the non-image area.

Example 15

Lithographic Printing Plate Precursor (1) was subjected to image exposure by a violet semiconductor laser plate setter Vx9600 (having InGaN semiconductor laser: emission: 405 nm±10 nm/output: 30 mW, produced by FUJIFILM Electronic Imaging, Ltd.). As for the image, halftone dots of 35% were drawn using an FM screen (TAFFETA 20, produced by Fuji Photo Film Co., Ltd.) in a plate surface exposure amount of 0.09 mJ/cm² and at resolution of 2,438 dpi. The exposed lithographic printing plate precursor was subjected to development processing within 30 seconds after the image exposure using an automatic processor (LP1250PLX, produced by Fuji Photo Film Co., Ltd.). The automatic processor was composed of a heating unit, a water-washing unit, a developing unit, a rinsing unit and a finishing unit in this order. The heating condition in the heating unit was 100° C. for 10 seconds. In all bathes of the water-washing unit, developing unit, rinsing unit and finishing unit, Developer (2) described above was charged. The temperature of the developer was 28° C. and the transportation of the lithographic printing plate precursor was performed at a transporting speed of 110 cm/min.

After the development processing, the non-image area and image area of the resulting lithographic printing plate were visually observed. As a result, it was found that the residue of the photosensitive layer was not present in the non-image area and the uniform halftone dot image free from unevenness was formed. Further, the printing was conducted using the lithographic printing plate under the same conditions as described above. As a result, good printed materials of uniform halftone dot image free from unevenness and without stain in the non-image area were obtained.

Example 16

The image exposure, development processing and printing were conducted in the same manner as in Example 1 except for changing Developer (1) to Developer (3) shown below. As a result, the evaluation results similar to those in Example 1 were obtained. The pH of Developer (3) was 4.0.

Developer (3)

| | |
|---|---|
| Water | 100 g |
| Polyoxyethylene laurylamino ether (Paionin D3110, produced by Takemoto Oil and Fat Co., Ltd.) | 10 g |

-continued

| | |
|---|---|
| Polystyrenesulfonic acid | 1 g |
| Ammonium primary phosphate | 0.05 g |
| Citric acid | 0.05 g |
| Tetrasodium salt of ethylenediaminetetraacetate | 0.05 g |

Example 17

The image exposure, development processing and printing were conducted in the same manner as in Example 16 except for changing the polyoxyethylene laurylamino ether (Paionin D3110, produced by Takemoto Oil and Fat Co., Ltd.) in Developer (3) to N-lauryldimethyl betaine (Paionin C157K, produced by Takemoto Oil and Fat Co., Ltd.). As a result, the evaluation results similar to those in Example 16 were obtained. The pH of the developer was 4.0.

Example 18

Lithographic Printing Plate Precursor (1) was subjected to the image exposure and development processing in the same manner as in Example 15 except that Developer (3) was charged in the baths of the developing unit and finishing unit and water was charged in the baths of the water-washing unit and rinsing unit in place of Developer (2).

After the development processing, the non-image area and image area of the resulting lithographic printing plate were visually observed. As a result, it was found that the residue of the photosensitive layer was not present in the non-image area and the uniform halftone dot image free from unevenness was formed. Further, the printing was conducted using the lithographic printing plate under the same conditions as described above. As a result, good printed materials of uniform halftone dot image free from unevenness and without stain in the non-image area were obtained.

Examples 19 to 23

An aqueous 8% by weight solution of each surfactant shown in Table 2 below was prepared. Lithographic Printing Plate Precursor (1) was immersed in each of the solutions while changing the immersion time at 5-second intervals. After the immersion, the surface of the lithographic printing precursor was rubbed with a sponge, followed by washing with water. The immersion time necessary for removing the photosensitive layer was determined and evaluated as the developing time. As the immersion time is shorter, the developing property is better.

TABLE 2

| | Surfactant | Developing Time (sec) |
|---|---|---|
| Example 19 | Polyoxyethylene naphthyl ether (Newcol B13, produced by Nippon Nyukazai Co., Ltd.) | 20 |
| Example 20 | Polyoxyethylene naphthyl ether sulfuric ester salt (Newcol B4SN, produced by Nippon Nyukazai Co., Ltd.) | 15 |
| Example 21 | Sodium alkylnaphthalenesulfonate (Pelex NB-L, produced by Kao Corp.) | 15 |
| Example 22 | Polyoxyethylene laurylamino ether (Paionin D3110, produced by Takemoto Oil and Fat Co., Ltd.) | 10 |
| Example 23 | N-Lauryldimethyl betaine (Paionin C157K, produced by Takemoto Oil and Fat Co., Ltd.) | 15 |

From the results shown above, it can be seen that favorable development can be conducted by using the developer containing the specific preferable surfactant.

This application is based on Japanese Patent application JP 2005-349608, filed Dec. 2, 2005 and Japanese Patent application JP 2006-123824, filed Apr. 27, 2006, the entire contents of which are hereby incorporated by reference, the same as if set forth at length.

What is claimed is:

1. A method for preparing a lithographic printing plate comprising:

exposing a lithographic printing plate precursor comprising a hydrophilic support, a photosensitive layer containing (A) a sensitizing dye having an absorption maximum in a wavelength range of from 350 to 450 nm represented by the following formula (I) or (II), (B) a polymerization initiator, (C) a polymerizable compound and (D) a hydrophobic binder polymer having an acid value of 0.3 meq/g or less and a protective layer provided in this order with a laser beam of from 350 to 450 nm; and rubbing a surface of the exposed lithographic printing plate precursor with a rubbing member in a presence of a developer having pH of from 2 to 10 in an automatic processor equipped with the rubbing member to remove the protective layer and an unexposed area of the photosensitive layer:

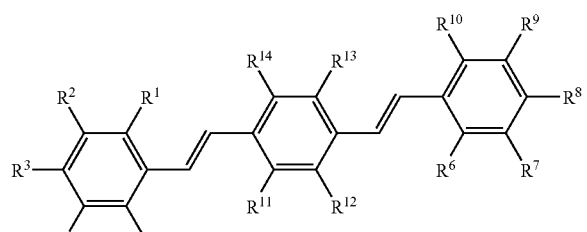

(I)

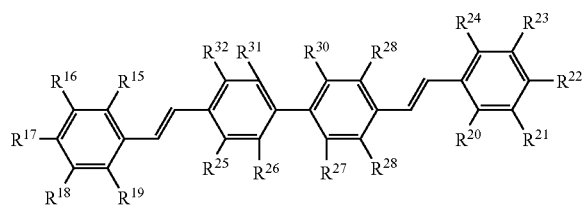

(II)

wherein $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms; and $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

2. The method as claimed in claim 1, wherein the polymerization initiator is a hexaarybiimidazole compound.

3. The method as claimed in claim 2, wherein the photosensitive layer further contains (E) a chain transfer agent.

4. The method as claimed in claim 3, wherein (E) the chain transfer agent is a thiol compound represented by the following formula (T):

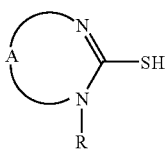

wherein R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

5. The method as claimed in claim 1, wherein the hydrophobic binder polymer is at least one member selected from the group consisting of a (meth)acrylic copolymer having a crosslinkable group in a side chain or a polyurethane resin having a crosslinkable group in a side chain.

6. The method as claimed in claim 1, wherein a part or all of components of the photosensitive layer is encapsulated in a microcapsule.

7. The method as claimed in claim 1, wherein the rubbing member comprises at least two rotating brush rollers.

8. The method as claimed in claim 1, wherein the pH of the developer is from 3 to 8.

9. The method as claimed in claim 1, wherein the exposed lithographic printing plate precursor is subjected to a heat treatment between the exposing and the rubbing.

10. A lithographic printing plate precursor comprising: a hydrophilic support; a photosensitive layer containing (A) a sensitizing dye having an absorption maximum in a wavelength range of from 350 to 450 nm represented by the following formula (I), or (II), (B) a polymerization initiator, (C) a polymerizable compound and (D) a hydrophobic binder polymer having an acid value of 0.3 meq/g or less; and a protective layer provided in this order, wherein the protective layer and an unexposed area of the photosensitive layer are capable of being removed by exposing the lithographic printing plate precursor with a laser beam of from 350 to 450 nm and rubbing a surface of the exposed lithographic printing plate precursor with a rubbing member in a presence of a developer having pH of from 2 to 10 in an automatic processor equipped with the rubbing member:

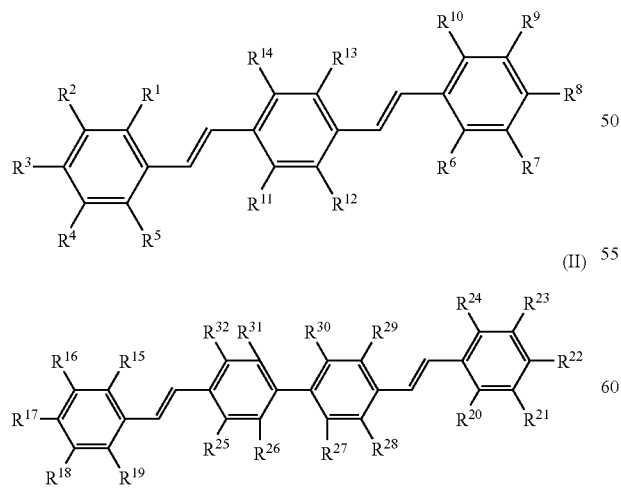

wherein $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms; and $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

11. The lithographic printing plate precursor as claimed in claim 10, wherein the polymerization initiator is a hexaarylbiimidazole compound.

12. The lithographic printing plate precursor as claimed in claim 11, wherein the photosensitive layer further contains (E) a chain transfer agent.

13. The lithographic printing plate precursor as claimed in claim 12, wherein the chain transfer agent is a thiol compound represented by the following formula (T):

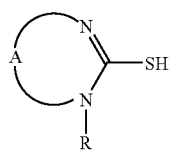

wherein R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

14. The lithographic printing plate precursor as claimed in claim 10, wherein the exposed lithographic printing plate precursor is subjected to a heat treatment between the exposing and the rubbing.

15. The method as claimed in claim 1, wherein the developer has a pH of from 2 to 8.

16. The method as claimed in claim 1, wherein the developer has a pH of from 2 to 5.

17. The method as claimed in claim 10, wherein the developer has a pH of from 2 to 5.

18. The method as claimed in claim 1, wherein the hydrophobic binder polymer contains an ethylenically unsaturated bonding group.

19. The method as claimed in claim 10, wherein the hydrophobic binder polymer contains an ethylenically unsaturated bonding group.

20. The method as claimed in claim 18, wherein the ethylenically unsaturated bonding group is represented by one of the following Formulas 1 to 3:

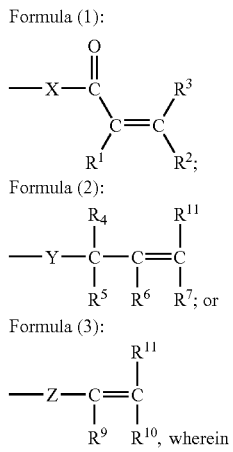

in formula (1), $R^1$ to $R^3$ each independently represents a hydrogen atom or a monovalent organic group such as a hydrogen atom or an alkyl group which may have a substituent; $R^2$ and $R^3$ each independently includes a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent; X represents an oxygen atom, a sulfur atom or —N($R^{12}$)—, wherein $R^{12}$ represents a hydrogen atom or a monovalent organic group such as an alkyl group which may have a substituent;

in formula (2), $R^4$ to $R^8$ each independently represents a hydrogen atom or a monovalent organic group such as a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent; Y represents an oxygen atom, a sulfur atom or —N($R^{12}$)—, wherein $R^{12}$ has the same meaning as $R^{12}$ defined in Formula (1); and in formula (3), $R^9$ represents a hydrogen atom or an alkyl group which may have a substituent; $R^{10}$ and $R^{11}$ each independently represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent; Z represents an oxygen atom, a sulfur atom, N($R^{13}$)— or a phenylene group which may have a substituent, wherein $R^{13}$ includes an alkyl group which may have a substituent, or the like.

21. The method as claimed in claim 19, wherein ethylenically unsaturated bonding group is represented by one of the following Formulas 1 to 3:

Formula (1):

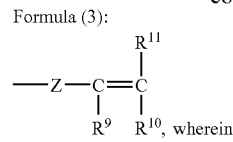

Formula (2):

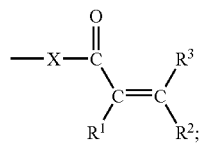

Formula (3):

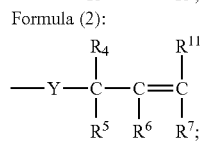

wherein in formula (1), $R^1$ to $R^3$ each independently represents a hydrogen atom or a monovalent organic group such as a hydrogen atom or an alkyl group which may have a substituent; $R^2$ and $R^3$ each independently includes a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent; X represents an oxygen atom, a sulfur atom or —N($R^{12}$)—, wherein $R^{12}$ represents a hydrogen atom or a monovalent organic group such as an alkyl group which may have a substituent;

in formula (2), $R^4$ to $R^8$ each independently represents a hydrogen atom or a monovalent organic group such as a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent; Y represents an oxygen atom, a sulfur atom or —N($R^{12}$)—, wherein $R^{12}$ has the same meaning as $R^{12}$ defined in Formula (1); and in formula (3), $R^9$ represents a hydrogen atom or an alkyl group which may have a substituent; $R^{10}$ and $R^{11}$ each independently represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent; Z represents an oxygen atom, a sulfur atom, N($R^{13}$)— or a phenylene group which may have a substituent, wherein $R^{13}$ includes an alkyl group which may have a substituent, or the like.

* * * * *